(12) United States Patent
Takabe et al.

(10) Patent No.: US 11,446,928 B2
(45) Date of Patent: Sep. 20, 2022

(54) LIQUID DISCHARGING HEAD AND METHOD OF MANUFACTURING LIQUID DISCHARGING HEAD

(71) Applicant: SEIKO EPSON CORPORATION, Tokyo (JP)

(72) Inventors: Motoki Takabe, Shiojiri (JP); Eiju Hirai, Azumino (JP); Hiroaki Okui, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/950,523

(22) Filed: Nov. 17, 2020

(65) Prior Publication Data

US 2021/0146686 A1    May 20, 2021

(30) Foreign Application Priority Data

Nov. 18, 2019  (JP) .............................. JP2019-207880

(51) Int. Cl.
  *B41J 2/14*   (2006.01)
  *H01L 41/047*  (2006.01)

(52) U.S. Cl.
  CPC ...... *B41J 2/14201* (2013.01); *H01L 41/0477* (2013.01); *B41J 2002/14491* (2013.01)

(58) Field of Classification Search
  None
  See application file for complete search history.

(56) References Cited

U.S. PATENT DOCUMENTS 5,818,482 A * 10/1998 Ohta .................... B41J 2/14274
                                                347/70
2016/0067967 A1   3/2016 Naganuma et al.
2016/0096368 A1 * 4/2016 Yazaki ................... B41J 2/1632
                                                347/70

FOREIGN PATENT DOCUMENTS

JP        2016-058467        4/2016

* cited by examiner

*Primary Examiner* — Erica S Lin
(74) *Attorney, Agent, or Firm* — Workman Nydegger

(57) ABSTRACT when one position where a distance in the second direction to the partition wall located at a nearest position in the second direction is long is assumed as a first position, and the other position where the distance is short is assumed as a second position, both the piezoelectric body and the vibration plate are provided at the first position and the second position, and a thickness of the vibration plate at the second position is smaller than a thickness of the vibration plate at the first position.

18 Claims, 12 Drawing Sheets

LIQUID DISCHARGING HEAD AND METHOD OF MANUFACTURING LIQUID DISCHARGING HEAD

The present application is based on, and claims priority from JP Application Serial Number 2019-207880, filed Nov. 18, 2019, the disclosure of which is hereby incorporated by reference herein in its entirety.

BACKGROUND

1. Technical Field

The present disclosure relates to a liquid discharging head and a method of manufacturing the liquid discharging head.

2. Related Art

A liquid discharging apparatus such as a printer is provided with a liquid discharging head that changes the volume of a pressure chamber accommodating ink by a piezoelectric actuator and discharges ink from a nozzle communicating with the pressure chamber. A piezoelectric actuator is provided with a piezoelectric body formed of a material indicating a piezoelectric effect such as lead zirconate titanate (PZT), a first electrode formed on one surface of the piezoelectric body, a second electrode formed on the other surface of the piezoelectric body, and a vibration plate. For example, in the piezoelectric actuator disclosed in JP-A-2016-58467, the piezoelectric body is provided in an active portion which is a region sandwiched between both electrodes and which is a region where a deflection is caused by applying a voltage to both electrodes. For example, the piezoelectric body is not provided in a non-active portion which is a region that is not the active portion, such as a region sandwiched between the vibration plate and the second electrode.

According to the technique disclosed in JP-A-2016-58467, since the piezoelectric body is not provided in the non-active portion, there is a possibility that stress is concentrated in the vicinity of a boundary between the active portion and the non-active portion when the piezoelectric body is deformed, and the piezoelectric actuator is cracked. In addition to the active portion, the non-active portion may be provided with the piezoelectric body. In addition, in providing the piezoelectric body also in the non-active portion, further improvement such as increasing the rigidity of the vibration plate is desired.

SUMMARY

According to an embodiment of the present disclosure, the liquid discharging head is provided. According to an aspect of the present disclosure, the liquid discharging head includes a piezoelectric body, a vibration plate provided on one side in a first direction with respect to the piezoelectric body, and a pressure chamber substrate provided on the one side with respect to the vibration plate, the pressure chamber substrate including a plurality of partition walls that partition a pressure chamber for applying a pressure to a liquid, the piezoelectric body, the vibration plate, and the pressure chamber substrate being provided side by side in the first direction, in which in two positions in a second direction intersecting with the first direction in the pressure chamber, when one position where a distance in the second direction to the partition wall located at a nearest position in the second direction is long is assumed as a first position, and the other position where the distance is short is assumed as a second position, both the piezoelectric body and the vibration plate are provided at the first position and the second position, and a thickness of the vibration plate at the second position is smaller than a thickness of the vibration plate at the first position.

DESCRIPTION OF EXEMPLARY EMBODIMENTS

A. First Embodiment

Figure 1:
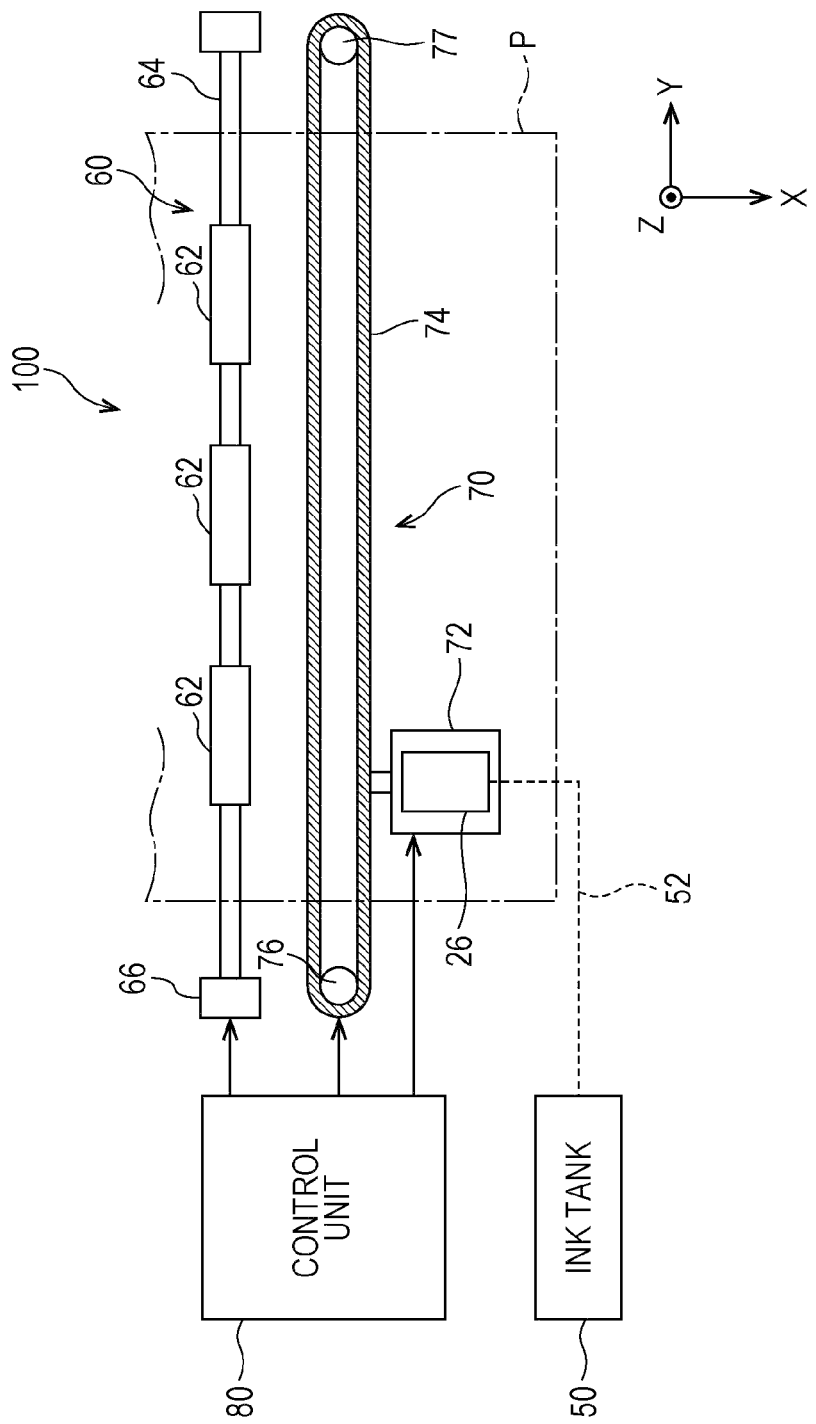
FIG. 1 is a block diagram illustrating a schematic configuration of a liquid discharging apparatus including a liquid discharging head according to an embodiment of the present disclosure.

A1. Overall Configuration of Liquid Discharging Apparatus:

FIG. 1 is a block diagram illustrating a schematic configuration of a liquid discharging apparatus 100 including a liquid discharging head 26 according to an embodiment of the present disclosure. In the present embodiment, the liquid discharging apparatus 100 is configured as an ink jet printer, and discharges ink onto a printing paper P to form an image. It should be noted that instead of the printing paper P, any type of media such as a resin film or cloth may be a target of ink discharge. FIG. 1 represents three axes that are orthogonal to each other, that is, an X-axis, a Y-axis, and a Z-axis. The Z-axis may be set parallel to the vertical direction, for example. An X-axis, a Y-axis, and a Z-axis described in the other FIGS all correspond to the X-axis, the Y-axis, and the Z-axis in FIG. 1. When a direction is specified, a positive direction is denoted by "+" and a negative direction is denoted by "−", and positive and negative symbols are used together in a direction notation. The positive direction and the negative direction are also called "axis directions". It should be noted that the Z-axis direction corresponds to a subordinate concept of the first direction in the present disclosure, and the X-axis direction corresponds to a subordinate concept of the second direction in the present disclosure. In addition, a +Z direction corresponds to a subordinate concept on one side of the first direction, and a −Z direction corresponds to a subordinate concept on the other side of the first direction. It should be noted that the X-axis, the Y-axis, and the Z-axis are not limited to being orthogonal, and may intersect at any angle.

The liquid discharging apparatus 100 includes the liquid discharging head 26, an ink tank 50, a transport mechanism 60, a movement mechanism 70, and a control unit 80.

The liquid discharging head 26 has a large number of nozzles and discharges ink in the −Z direction to form an image on the printing paper P. The detailed configuration of the liquid discharging head 26 will be described later. As the discharged ink, for example, a total of four inks, for example, black, cyan, magenta, and yellow may be discharged. It should be noted that in addition to the above four colors, ink of any color such as light cyan, light magenta, and white may be discharged. The liquid discharging head 26 is mounted on a carriage 72, which will be described later, included in the movement mechanism 70, and reciprocates in the main scanning direction as the carriage 72 moves. In the present embodiment, the main scanning directions are a +Y direction and a −Y direction. The +Y direction and the −Y direction are also called "Y-axis direction".

The ink tank 50 accommodates the ink discharged from the liquid discharging head 26. The ink tank 50 is not mounted on the carriage 72. The ink tank 50 and the liquid discharging head 26 are coupled by a resin tube 52, and ink is supplied from the ink tank 50 to the liquid discharging head 26 via the tube 52. It should be noted that instead of the ink tank 50, a bag-shaped liquid pack formed of a flexible film may be used.

The transport mechanism 60 transports the printing paper P in a sub-scanning direction. The sub-scanning direction is a direction orthogonal to the Y-axis direction, which is the main scanning direction, and is the +X direction and the −X direction in the present embodiment. The +X direction and the −X direction are also called "X-axis direction". The transport mechanism 60 includes a transport rod 64 to which three transport rollers 62 are attached, and a transport motor 66 that rotationally drives the transport rod 64. When the transport motor 66 rotationally drives the transport rod 64, a plurality of transport rollers 62 rotates and the printing paper P is transported in the +X direction, which is the sub-scanning direction. It should be noted that the number of the transport rollers 62 is not limited to three and may be any number. In addition, it may be configured to include a plurality of transport mechanisms 60.

The movement mechanism 70 includes a transport belt 74, a movement motor 76, and a pulley 77 in addition to the carriage 72 described above. The carriage 72 mounts the liquid discharging head 26 in a state capable of discharging ink. The carriage 72 is attached to the transport belt 74. The transport belt 74 is stretched between the movement motor 76 and the pulley 77. When the movement motor 76 is rotationally driven, the transport belt 74 reciprocates in the main scanning direction. As a result, the carriage 72 attached to the transport belt 74 also reciprocates in the main scanning direction.

The control unit 80 controls the entire liquid discharging apparatus 100. For example, the control unit 80 controls a reciprocating operation of the carriage 72 along the main scanning direction and a transporting operation of the printing paper P along the sub-scanning direction. In the present embodiment, the control unit 80 also functions as a drive control portion of a piezoelectric actuator described later. That is, the control unit 80 controls the ink discharge onto the printing paper P by outputting a drive signal to the liquid discharging head 26 to drive the piezoelectric actuator. The control unit 80 may include, for example, a processing circuit such as a central processing Unit (CPU) or a field programmable gate array (FPGA) and a storage circuit such as a semiconductor memory.

Figure 2:
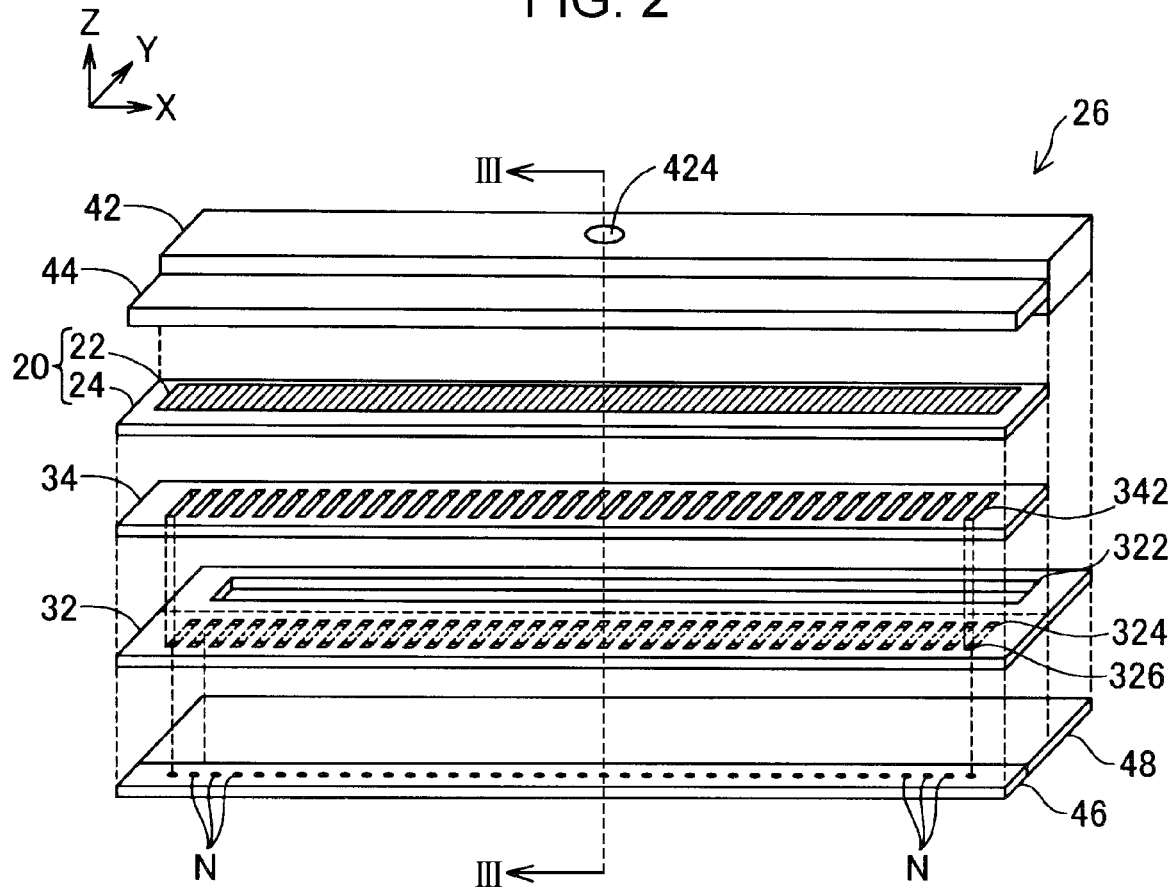
FIG. 2 is an exploded perspective view illustrating a detailed configuration of a liquid discharging head.
Figure 3:
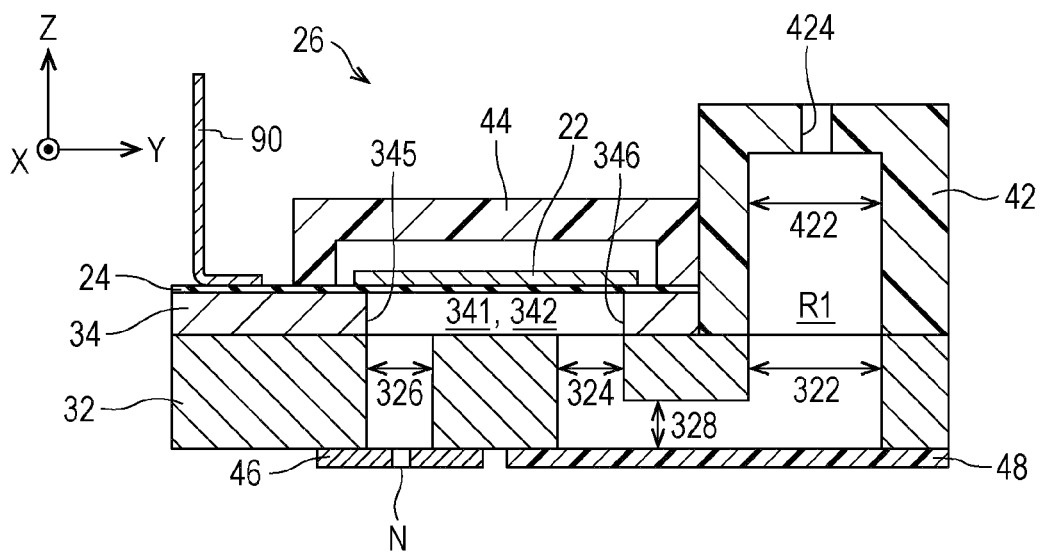
FIG. 3 is a sectional view illustrating a detailed configuration of a liquid discharging head.

A2. Detailed Configuration of Liquid Discharging Head:

FIG. 2 is an exploded perspective view illustrating a detailed configuration of the liquid discharging head 26. FIG. 3 is a sectional view illustrating a detailed configuration of the liquid discharging head 26. FIG. 3 represents the III-III cross-section illustrated in FIG. 2. FIG. 2 illustrates the configuration of the liquid discharging head 26 for one color. Therefore, it may be configured to include a plurality of liquid discharging heads 26 illustrated in FIG. 2 according to the number of colors of ink to be discharged. In addition, it may be configured to include the plurality of liquid discharging heads 26 illustrated in FIG. 2 for each color.

As illustrated in FIG. 2, the liquid discharging head 26 includes a nozzle plate 46, a vibration absorber 48, a flow path substrate 32, a pressure chamber substrate 34, a casing portion 42, a sealing body 44, and a piezoelectric actuator 20.

The nozzle plate 46 is a thin plate member in which a large number of nozzles N are formed side by side in a line along the Y-axis direction. It should be noted that the number of rows of nozzles N is not limited to one, and may be any number. The nozzle N is formed as a through hole in the nozzle plate 46 in a thickness direction (Z-axis direction). The nozzle N corresponds to an ink discharge opening from the liquid discharging head 26. The nozzle plate 46 is located in the most −Z direction in the liquid discharging head 26. In the present embodiment, the nozzle plate 46 is made of stainless steel (SUS). It should be noted that the material is not limited to the stainless steel, and may be formed of the other types of metals such as nickel (Ni) alloy, resin materials such as polyimide and dry film resist, and inorganic materials such as a silicon single crystal substrate.

The vibration absorber 48 is a flexible sheet-like member that is elastically deformable. The vibration absorber 48, similarly to the nozzle plate 46, is located in the most −Z direction in the liquid discharging head 26 and is disposed side by side with the nozzle plate 46. As illustrated in FIG. 3, the vibration absorber 48 absorbs pressure deformation of a liquid reserve chamber R1 formed between the inside of the casing portion 42 and the flow path substrate 32. The vibration absorber 48 closes an opening portion 322, which will be described later, formed in the flow path substrate 32, a relay flow path 328, and a plurality of supply flow paths 324 to form a bottom surface of the liquid reserve chamber R1. The vibration absorber 48 may be composed of, for example, a resin sheet member. The vibration absorber 48 is also called a compliance substrate.

The flow path substrate 32 is a plate-like member for forming a flow path of ink. As illustrated in FIG. 3, a surface of the flow path substrate 32 in the −Z direction is bonded to the nozzle plate 46 and the vibration absorber 48, respectively. Such bonding may be realized using an adhesive, for example. In the present embodiment, the flow path substrate 32 is composed of the silicon (Si) single crystal substrate. It should be noted that it is not limited to the silicon single crystal substrate and may be composed of a substrate containing silicon as a main component. As illustrated in FIGS. 2 and 3, the flow path substrate 32 is formed with the opening portion 322, the supply flow path 324, and a communication flow path 326.

As illustrated in FIG. 2, when viewed in the Z-axis direction, the opening portion 322 is formed as a through hole having a substantially rectangular plan view shape with the X-axis direction as the longitudinal direction. The opening portion 322 is formed as a single through hole including both the supply flow path 324 corresponding to each nozzle N and a position corresponding to the Y-axis direction. As illustrated in FIG. 3, the opening portion 322 forms the liquid reserve chamber R1 together with an accommodating portion 422, which will be described later, of the casing portion 42. The liquid reserve chamber R1 temporarily reserves the ink supplied from the ink tank 50 via the tube 52. The liquid reserve chamber R1 is also called a reservoir.

As illustrated in FIG. 2, the supply flow path 324 is formed at a position corresponding to each nozzle N in the +Y direction, respectively. Therefore, each of the supply flow paths 324 are disposed side by side in a line in the X-axis direction similarly to the nozzle N. The supply flow path 324 is formed as a through hole that penetrates the flow path substrate 32 in the thickness direction. As illustrated in FIG. 3, a groove is formed between the opening portion 322 and the supply flow path 324 on the surface of the flow path substrate 32 in the −Z direction, more specifically, on the surface of the flow path substrate 32 on the vibration absorber 48 side. A region surrounded by the groove and the vibration absorber 48 functions as the relay flow path 328. The opening portion 322 (liquid reserve chamber R1) and the supply flow path 324 communicate with each other through the relay flow path 328. The relay flow path 328 relays the ink from the liquid reserve chamber R1 to the supply flow path 324. The supply flow path 324 communicates with a pressure chamber 341 and supplies the ink to the pressure chamber 341.

As illustrated in FIG. 2, the communication flow path 326 is formed at a position corresponding to each nozzle N in the +Z direction and at a position corresponding to each supply flow path 324 in the −Y direction, respectively. Therefore, each of the communication flow paths 326 are disposed side by side in a line in the X-axis direction, similarly to the nozzle N and the supply flow path 324. As illustrated in FIG. 3, the communication flow path 326 communicates with the nozzle N and the pressure chamber 341, respectively, and supplies the ink in the pressure chamber 341 to the nozzle N.

The pressure chamber substrate 34 is a plate-like member for forming the pressure chamber 341. As illustrated in FIG. 3, a surface of the pressure chamber substrate 34 in the −Z direction is bonded to a surface of the flow path substrate 32 in the +Z direction. Such bonding may be achieved using an adhesive. In the present embodiment, the pressure chamber substrate 34 is composed of the silicon single crystal substrate similarly to the flow path substrate 32. It should be noted that it is not limited to the silicon single crystal substrate and may be composed of a substrate containing silicon as a main component. As illustrated in FIGS. 2 and 3, the pressure chamber substrate 34 is formed with a plurality of pressure chamber forming portions 342.

When viewed in the Z-axis direction, each of the pressure chamber forming portions 342 are formed as a through hole having a substantially rectangular plan view shape with the Y-axis direction as the longitudinal direction. Each of the pressure chamber forming portions 342 are formed at a position corresponding to each nozzle N in the +Z direction, respectively. Therefore, each of the pressure chamber forming portions 342 is formed side by side in a line in the X-axis direction similarly to the nozzle N. The pressure chamber forming portion 342 forms the pressure chamber 341 by being bonded to a vibration plate 24, which will be described later, included in the piezoelectric actuator 20. Side walls 345 and 346 of each of the pressure chamber forming portions 342 in the Y-axis direction function as partition walls that partition the pressure chamber 341. The pressure chamber 341 communicates with the supply flow path 324 and the communication flow path 326, and accommodates the ink supplied from the supply flow path 324. The volume of the pressure chamber 341 changes as the vibration plate 24, which will be described later, deforms.

The casing portion 42 has a hollow substantially square columnar appearance shape that is open on one side. In the present embodiment, the casing portion 42 is made of resin. As illustrated in FIG. 3, the casing portion 42 is bonded to the surface of the flow path substrate 32 in the +Z direction. The accommodating portion 422 is formed inside the casing portion 42. The accommodating portion 422 is open in the −Z direction, and the accommodating portion 422 communicates with the opening portion 322 at the opening to form the liquid reserve chamber R1. As illustrated in FIGS. 2 and 3, an inlet 424 is formed at an end portion (ceiling portion) of the casing portion 42 in the +Z direction. The inlet 424 penetrates, in the thickness direction (Z-axis direction), the end portion of the casing portion 42 in the +Z direction and communicates with the liquid reserve chamber R1. The tube 52 illustrated in FIG. 1 is coupled to the inlet 424. It should be noted that an ink reserve portion (not illustrated) (for example, a sub tank) may be coupled to the inlet 424 via a tube (not illustrated). In this configuration, the ink may be supplied from the ink tank 50 to the ink reserve portion via the tube 52.

The sealing body 44 has a hollow substantially square columnar appearance shape that is open on one side. In the present embodiment, the sealing body 44 is made of resin. As shown in FIG. 3, the casing portion 42 is disposed such that a piezoelectric portion 22 described later is accommodated in a space inside itself, and is bonded to a surface of the vibration plate 24 described later in the +Z direction. The sealing body 44 protects the piezoelectric portion 22 and reinforces a mechanical strength of a part of the pressure chamber substrate 34 and the vibration plate 24.

As shown in FIG. 3, in the liquid discharging head 26, a wiring substrate 90 is coupled to the surface of the vibration plate 24 in the +Z direction. On the wiring substrate 90, a plurality of wirings for being coupled to the control unit 80 and a power supply circuit (not shown) are formed. In the present embodiment, the wiring substrate 90 is composed of, for example, a flexible printed circuit (FPC). It should be noted that instead of the FPC, it may be configured by any substrate having flexibility such as a flexible flat cable (FFC). The wiring substrate 90 supplies a drive signal for driving the piezoelectric actuators 20 to each piezoelectric actuator 20.

The piezoelectric actuator 20 changes the volume of the pressure chamber 341 by deforming itself, and causes ink to flow out from the pressure chamber 341.

Figure 4:
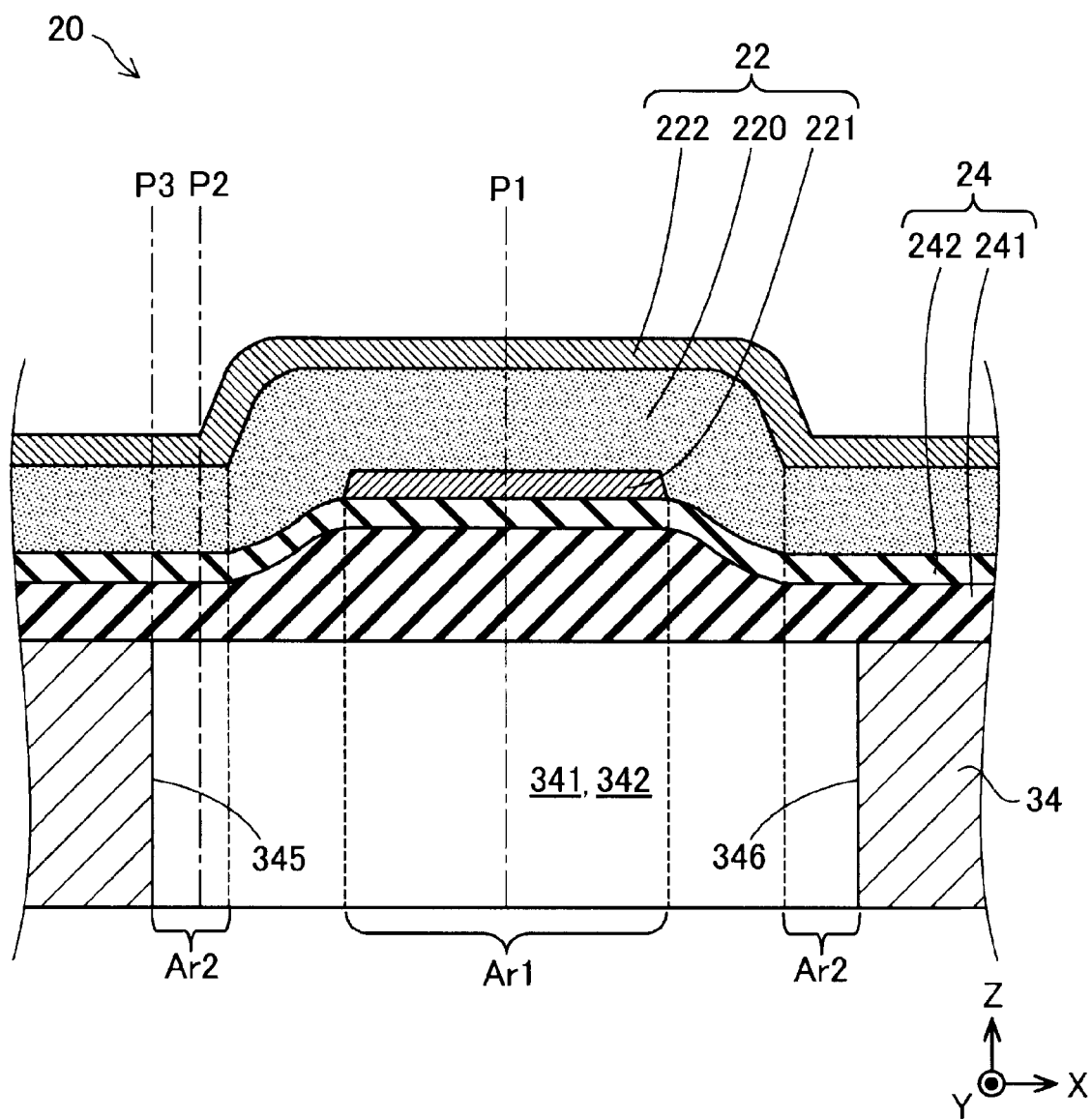
FIG. 4 is a sectional view schematically illustrating a detailed configuration of a piezoelectric actuator.

FIG. 4 is a sectional view schematically illustrating a detailed configuration of the piezoelectric actuator 20. In FIG. 4, the pressure chamber substrate 34 of the liquid discharging head 26 is also illustrated for convenience of description. The piezoelectric actuator 20 includes the vibration plate 24 and a plurality of piezoelectric portions 22.

The vibration plate 24 includes an elastic body layer 241 and an insulation layer 242. The vibration plate 24 has a structure in which the elastic body layer 241 and the insulation layer 242 are stacked in the Z-axis direction. The elastic body layer 241 is disposed on the surface of the pressure chamber substrate 34 in the +Z direction. The insulation layer 242 is disposed on the surface of the elastic body layer 241 in the +Z direction. The elastic body layer 241 is made of silicon dioxide ($SiO_2$). The insulation layer 242 is made of zirconium oxide ($ZrO_2$).

The piezoelectric portion 22 includes a piezoelectric body 220, a first electrode 221, and a second electrode 222. Similar to the vibration plate 24, the piezoelectric portion 22 has a structure in which each layer of the piezoelectric body 220, the first electrode 221, and the second electrode 222 is stacked in the Z-axis direction.

The piezoelectric body 220 is a film-like member formed of a material having a piezoelectric effect, and is deformed according to a voltage applied to the first electrode 221 and the second electrode 222. The piezoelectric body 220 is disposed so as to cover a surface of a part of the insulation layer 242 of the vibration plate 24 in the +Z direction and a surface of the first electrode 221 in the +Z direction. The piezoelectric body 220 has a tapered shape in which a surface in the +Z direction slightly protrudes in the +Z direction at a portion in the vicinity of the center in the X-axis direction, and a dimension in the X-axis direction increases from the +Z direction toward the −Z direction.

In the present embodiment, the piezoelectric body 220 is made of lead zirconate titanate (PZT). It should be noted that the piezoelectric body 220 may be formed of another kind of ceramics having an $ABO_3$ type perovskite structure, for example, barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, lead scandium niobate, or the like, instead of lead zirconate titanate. In addition, the piezoelectric body 220 is not limited to ceramics, and may be formed of any material having a piezoelectric effect, such as polyvinylidene fluoride and quartz.

The first electrode 221 and the second electrode 222 are a pair of electrodes that sandwich the piezoelectric body 220. The first electrode 221 is located on the vibration plate 24 side with respect to the piezoelectric body 220, and is provided on the surface of the insulation layer 242 of the vibration plate 24 in the +Z direction. The first electrode 221 is disposed so as to cover the center of the pressure chamber 341 in the X-axis direction. The first electrode 221 is formed in the tapered shape in which the dimension in the X-axis direction increases from the +Z direction toward the −Z direction. The second electrode 222 is located on the opposite side of the piezoelectric body 220 from the vibration plate 24 side, and is provided on a surface of the piezoelectric body 220 in the +Z direction. The second electrode 222 covers an outer shape of the piezoelectric body 220.

The first electrode 221 and the second electrode 222 are both electrically coupled to the wiring substrate 90, and a voltage corresponding to a driving signal supplied from the wiring substrate 90 is applied to the piezoelectric body 220. Different drive voltages are supplied to the first electrode 221 according to a discharge amount of ink, and a constant holding voltage is supplied to the second electrode 222 regardless of the discharge amount of ink. As a result, a potential difference is generated between the first electrode 221 and the second electrode 222, and the piezoelectric body 220 is deformed. As a result, the pressure chamber 341 is deformed, pressure is applied to the ink accommodated in the pressure chamber 341, and the ink is discharged from the nozzle N via the communication flow path 326.

In the present embodiment, the first electrode 221 is coupled to the individual wiring extending from the wiring substrate 90 to each piezoelectric actuator 20. The first electrode 221 is so-called individual electrodes that are individually provided to each piezoelectric actuator 20. On the other hand, the second electrode 222 is a common electrode common to each piezoelectric actuator 20, and is coupled to one common wiring extending from the wiring substrate 90. For example, the above-mentioned individual wiring may have contact holes in advance in the insulation layer 242 formed on the outer surface of the first electrode 221, and may contact the first electrode 221 via the contact holes. In addition, the above-mentioned common electrode may be formed, for example, slightly larger than the piezoelectric body 220 when the second electrode 222 is viewed in the −Z direction, the insulation layer may be formed in a portion of the second electrode 222 where the piezoelectric body 220 is not present in the +Z direction, the contact hole may be provided in advance in the insulation layer and the common electrode may be in contact with the second electrode 222 of each piezoelectric actuator 20 via the contact hole.

In the present embodiment, the first electrode 221 and the second electrode 222 are made of platinum (Pt). It should be noted that instead of platinum, it may be formed of any conductive material such as gold (Au) or iridium (Ir).

As shown in FIG. 4, the vibration plate 24, the first electrode 221, the piezoelectric body 220, and the second electrode 222 are disposed in order from the −Z direction toward the +Z direction in a region Ar1 that is the central portion inside the pressure chamber 341 in the X-axis direction. In addition, the vibration plate 24, the piezoelectric body 220, and the second electrode 222 are disposed in order from the −Z direction toward the +Z direction in each of the two regions Ar2 at the end portions in the pressure chamber 341 in the X-axis direction. That is, both the vibration plate 24 and the piezoelectric body 220 are provided in the regions Ar1 and Ar2.

In the present embodiment, the region Ar1 is a region corresponding to the active portion in which a deflection is caused by applying a voltage to the first electrode 221 and the second electrode 222, and is, for example, a region at the central portion of the pressure chamber 341 in the X-axis direction. The length of the region Ar1 in the X-axis direction is substantially the same as the length of the first electrode 221 in the X-axis direction. In addition, the regions Ar2 are located outside the region Ar1 in the X-axis direction, that is, in the −X direction with respect to the region Ar1 and in the +X direction with respect to the region Ar1, and is closer to the partition walls 345 and 346 of the pressure chamber 341 than the region Ar1. The regions Ar2 are also a region corresponding to the non-active portion. The regions Ar2 can be, for example, regions at two end portions of the pressure chamber 341 in the X-axis direction. As shown in FIG. 4, the region Ar1 includes a central position P1 in the pressure chamber 341 in the X-axis direction. The regions Ar2 include, in the X-axis direction, a position P3 overlapping the partition wall 345 and a position P2 located closer to the partition wall 345 than the position P1 in the region Ar1. In the positions P1 and P2, of some two positions inside the pressure chamber 341 in the X-axis direction, a position where a distance in the X-axis direction to the partition wall 345 located at a nearest position in the X-axis direction is long is assumed as the position P1, and a position where the distance is short is assumed as the position P2. In the following description, the region Ar1 is also called a first region Ar1, the regions Ar2 are called second regions Ar2, the position P1 is called a first position P1, the position P2 is called a second position P2, and the position P3 is called a third position P3.

As shown in FIG. 4, the vibration plate 24 is formed such that a surface in the first region Ar1 in the +Z direction has a convex shape slightly protruding in the +Z direction from surfaces in the second regions Ar2 in the +Z direction. Therefore, in the vibration plate 24, the thickness in the first region Ar1 is different from the thickness in the second regions Ar2. Similarly, the piezoelectric body 220 is also formed such that the surface in the first region Ar1 in the +Z direction has a convex shape slightly protruding in the +Z direction from the surface in the second regions Ar2 in the +Z direction, and the thickness in the first region Ar1 is different from the thickness in the second regions Ar2. In the present embodiment, the thicknesses of the vibration plate 24 and the piezoelectric body 220 are made different between the first region Ar1 and the second regions Ar2 for the following reason.

The inventors of the present disclosure, on the assumption that the piezoelectric body 220 is provided in the first region Ar1 and the second regions Ar2, considered to further suppress the occurrence of cracks by improving the rigidity of the vibration plate 24. Then, the inventors of the present disclosure found that various problems can occur when simply increasing the thickness of the vibration plate 24 in order to increase the rigidity of the vibration plate 24. For example, there may be problems that when the pressure chamber 341 is formed on the pressure chamber substrate 34, the vibration plate 24 is warped and the manufacturing process is complicated, and when a neutral axis of the piezoelectric actuator 20, for example, a neutral axis in the second regions Ar2, is disposed on the vibration plate 24 side, the insulation layer 242 is pulled toward the elastic body layer 241 at a boundary surface between the elastic body layer 241 and the insulation layer 242 of the vibration plate 24 and cracks may occur. The neutral axis in the following description indicates a position in the Z-axis direction, but is simply described as the neutral axis.

As a result of research, the inventors of the present disclosure found the following four things.
(1) In order to suppress the generation of cracks, it is preferable to provide both the piezoelectric body 220 and the vibration plate 24 in the first region Ar1 and the second regions Ar2.
(2) In the first region Ar1, the discharge characteristics of the liquid discharging head 26 can be maintained by disposing the neutral axis at a position closer to the vibration plate 24 side than the piezoelectric body 220.
(3) In the second regions Ar2, the generation of cracks can be suppressed by disposing the neutral axis at a position closer to the piezoelectric body 220 side than the vibration plate 24.
(4) When the thickness of the piezoelectric body 220 is largely changed from the existing thickness in order to realize the above (2) and (3), the piezoelectric performance of the piezoelectric portion 22 is reduced and the manufacturing process is complicated.

The inventors of the present disclosure obtained new knowledge that an arrangement position of the neutral axis in the first region Ar1 and an arrangement position of the neutral axis in the second regions Ar2 can be separately controlled by controlling the thickness of the vibration plate 24. Specifically, the above (2) and (3) can be satisfied by making the thickness of the vibration plate 24 in the second regions Ar2 smaller than the thickness of the vibration plate 24 in the first region Ar1. The details will be described below.

Figure 5:
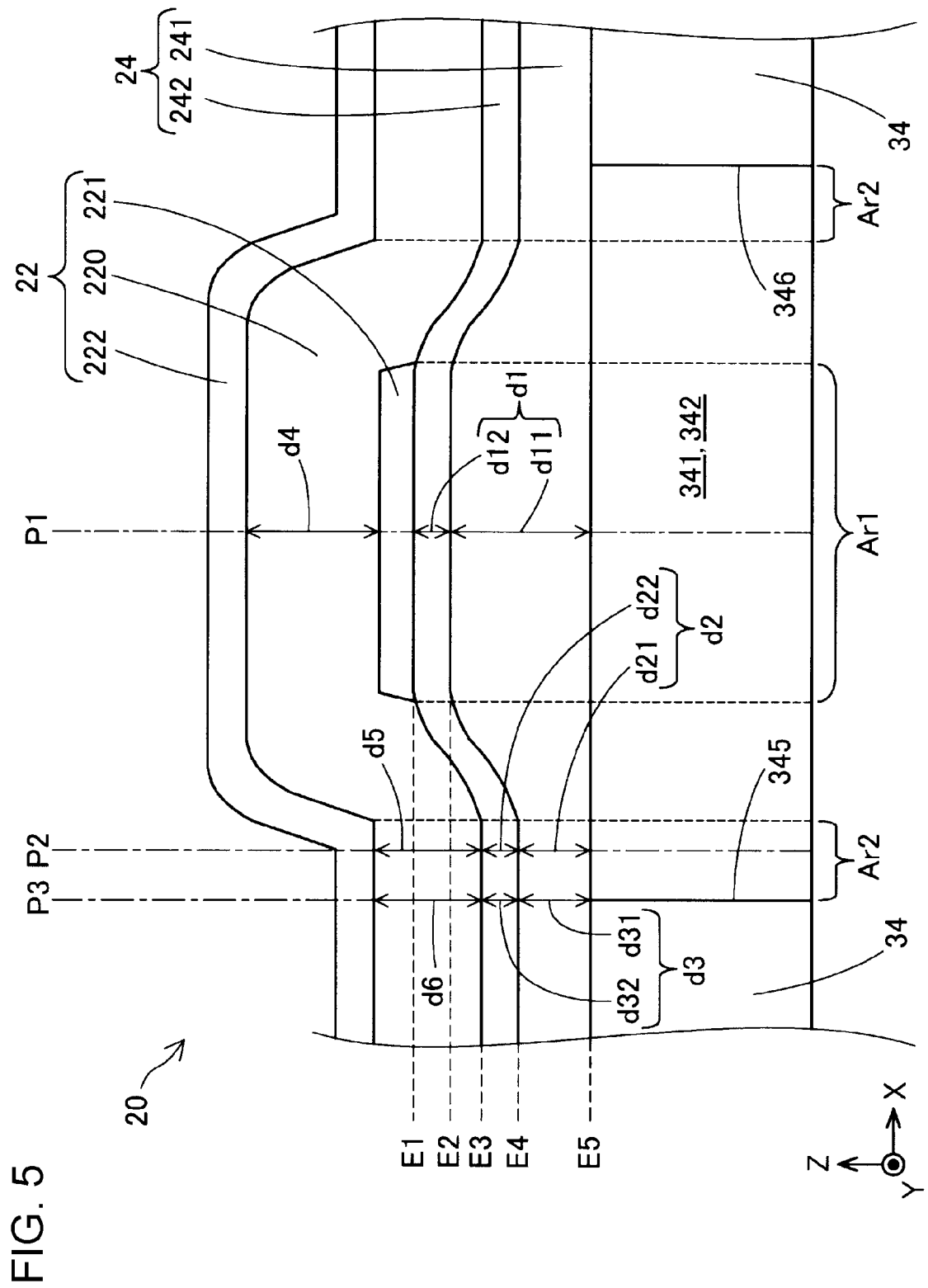
FIG. 5 is an enlarged view of a piezoelectric actuator.

FIG. 5 is an enlarged view of the piezoelectric actuator 20. For convenience of description, hatching is omitted in FIG. 5. As shown in FIG. 5, a thickness d2 of the vibration plate 24 at the second position P2 is smaller than a thickness d1 of the vibration plate 24 at the first position P1. Specifically, a thickness d21 of the elastic body layer 241 at the second position P2 is smaller than a thickness d11 of the elastic body layer 241 at the first position P1. In addition, a thickness d22 of the insulation layer 242 at the second position P2 is equal to a thickness d12 of the insulation layer 242 at the first position P1. It should be noted that at the first position P1, the thickness d11 of the elastic body layer 241 is, for example, 1600 nanometers, and the thickness d12 of the insulation layer 242 is, for example, 100 nanometers. In addition, at the second position P2, the thickness d21 of the elastic body layer 241 is, for example, 400 nanometers, and the thickness d22 of the insulation layer 242 is, for example, 100 nanometers.

In the second regions Ar2, a thickness d3 of the vibration plate 24 at the third position P3 is the same as the thickness d2 of the vibration plate 24 at the second position P2. Specifically, a thickness d31 of the elastic body layer 241 at the third position P3 is the same as the thickness d21 of the elastic body layer 241 at the second position P2. In addition, a thickness d32 of the insulation layer 242 at the third position P3 is the same as the thickness d22 of the insulation layer 242 at the second position P2. Therefore, the thickness d3 of the vibration plate 24 at the third position P3 is smaller than the thickness d1 of the vibration plate 24 at the first position P1 similarly to the second position P2.

As shown in FIGS. 4 and 5, a surface of the vibration plate 24 in the −Z direction, that is, a surface of the elastic body layer 241 in the −Z direction is parallel to the X-axis direction. Therefore, as shown in FIG. 5, at the first position P1, the second position P2, and the third position P3, the end portion E5 of the vibration plate 24 in the −Z direction is disposed at the same position in the Z-axis direction.

On the other hand, the surface of the vibration plate 24 in the +Z direction, that is, the surface of the insulation layer 242 in the +Z direction is located in the +Z direction further in the first region Ar1 than a position in the +Z direction in the second regions Ar2. Specifically, an end portion E1 of the insulation layer 242 at the first position P1 in the +Z direction is disposed closer to the piezoelectric body 220 than an end portion E3 of the insulation layer 242 at the second position P2 in the +Z direction. In other words, the end portion E3 of the insulation layer 242 at the second position P2 in the +Z direction is disposed in the −Z direction from the end portion E1 of the insulation layer 242 at the first position P1 in the +Z direction.

Similarly, the surface of the elastic body layer 241 in the +Z direction is also located in the first region Ar1 in the +Z direction from the position in the second regions Ar2 in the +Z direction. Specifically, an end portion E2 of the elastic body layer 241 at the first position P1 in the +Z direction is disposed closer to the piezoelectric body 220 than an end portion E4 of the elastic body layer 241 in the second position P2 in the +Z direction. In other words, the end portion E4 of the elastic body layer 241 at the second position P2 in the +Z direction is disposed in the −Z direction from the end portion E2 of the elastic body layer 241 at the first position P1 in the +Z direction.

Therefore, in the present embodiment, in the +Z direction from an end portion E5 of the vibration plate 24 in the −Z direction, the end portion E1 of the first region Ar1 in the +Z direction is disposed in the +Z direction more than the end portion E3 of the second regions Ar2 in the +Z direction. Therefore, it can be said that the thickness of the vibration plate 24 in the second regions Ar2 is made smaller than the thickness of the vibration plate 24 in the first region Ar1.

Regarding the thickness of the piezoelectric body 220, similarly to the vibration plate 24, a thickness d5 of the piezoelectric body 220 at the second position P2 is smaller than a thickness d4 of the piezoelectric body 220 at the first position P1. The thickness d5 of the piezoelectric body 220 at the second position P2 is larger than the thickness d2 of the vibration plate 24 at the second position P2. The thickness d4 of the piezoelectric body 220 at the first position P1 is smaller than the thickness d1 of the vibration plate 24 at the first position P1. It should be noted that a thickness d6 of the piezoelectric body 220 at the third position P3 is the same as the thickness d5 of the piezoelectric body 220 at the second position P2. It should be noted that the thickness d4 of the piezoelectric body 220 at the first position P1 is, for example, 1200 nanometers, and the thickness d5 of the piezoelectric body 220 at the second position P2 and the thickness d6 of the piezoelectric body 220 at the third position P3 are, for example, 600 nanometers.

Therefore, a sum of the thickness d2 of the vibration plate 24 and the thickness d5 of the piezoelectric body 220 in the second regions Ar2 is smaller than a sum of the thickness d1 of the vibration plate 24 and the thickness d4 of the piezoelectric body 220 in the first region Ar1. In addition, the sum of the thickness d2 of the vibration plate 24 at the second position P2 and the thickness d5 of the piezoelectric body 220 at the second position P2 is larger than the thickness d1 of the vibration plate 24 at the first position P1 and is also larger than the thickness d4 of the piezoelectric body 220 at the first position P1. Therefore, a difference between the thickness d2 of the vibration plate 24 and the thickness d5 of the piezoelectric body 220 at the second position P2 is smaller than a difference between the thickness d1 of the vibration plate 24 at the first position P1 and the thickness d4 of the piezoelectric body 220 at the first position P1.

As described above, in the piezoelectric actuator 20 having such a configuration, in the first region Ar1 including the first position P1, the neutral axis can be disposed at a position closer to the vibration plate 24 side than the piezoelectric body 220, and in the second regions Ar2 including the second position P2 and the third position P3, the neutral axis can be disposed at a position closer to the piezoelectric body 220 side than the vibration plate 24. It should be noted that more preferably, the neutral axis of the piezoelectric actuator 20 in the first region Ar1 is located inside the vibration plate 24 and the neutral axis of the piezoelectric actuator 20 in the second regions Ar2 is located inside the piezoelectric body 220.

Figure 6:
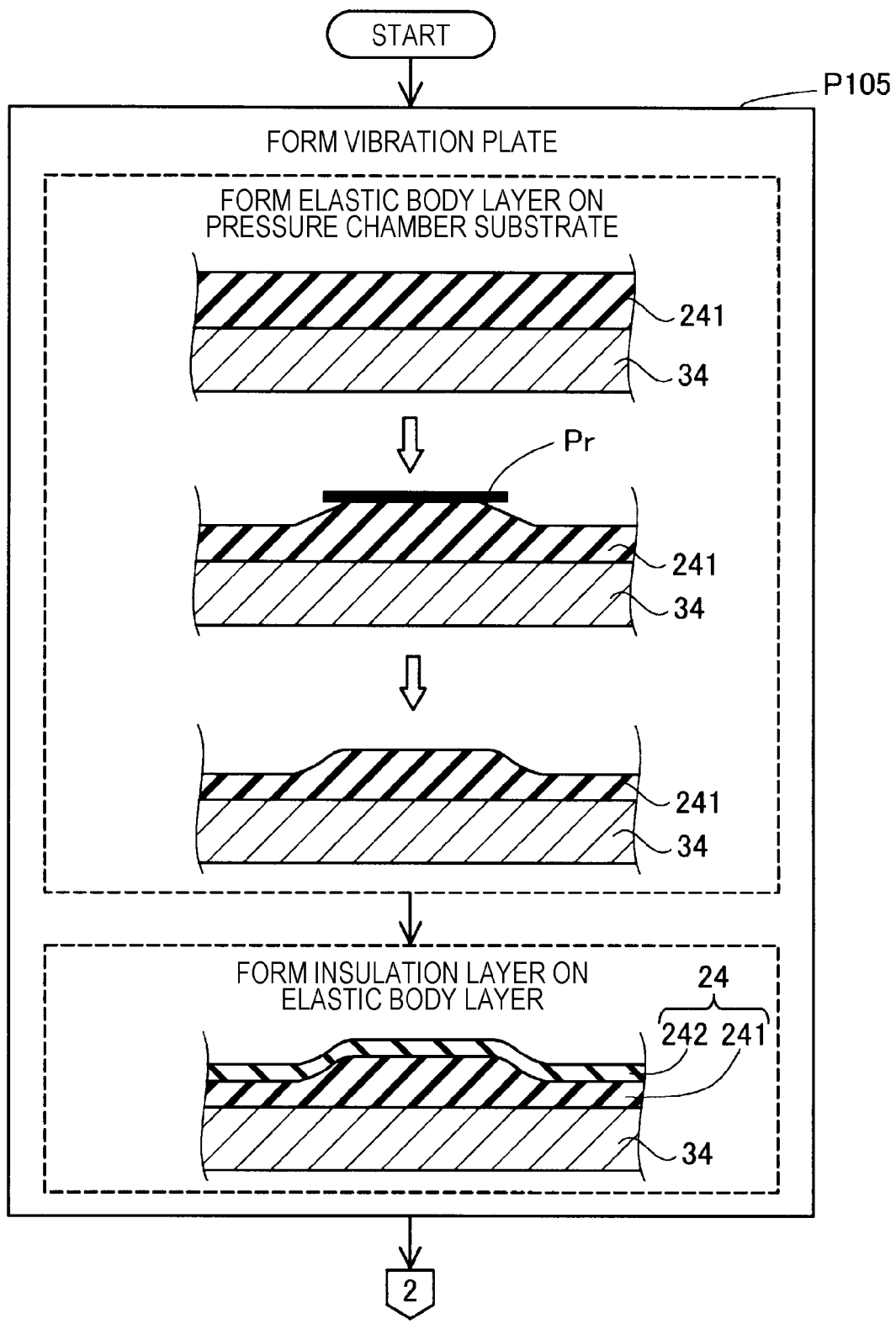
FIG. 6 is a process diagram illustrating a method of manufacturing a liquid discharging head.

A3. Method of Manufacturing Liquid Discharging Head:

FIGS. 6, 7, 8, and 9 are process diagrams illustrating methods of manufacturing the liquid discharging head 26. FIGS. 6, 7, 8, and 9 illustrate manufacturing processes of the piezoelectric actuator 20 among the manufacturing processes of the liquid discharging head 26. As shown in FIG. 6, in process P105, the vibration plate 24 is formed on a surface of the pressure chamber substrate 34 in the +Z direction before the pressure chamber forming portion 342 is formed. Specifically, the vibration plate 24 is formed by using a microfabrication technique related to the manufacture of micro electro mechanical systems (MEMS). First, the elastic body layer 241 is formed on the surface of the pressure chamber substrate 34 by thermal oxidation. It is preferable that the elastic body layer 241 is formed to have a thickness of 1700 nanometers, for example. The elastic body layer 241 may be formed by a chemical vapor deposition (CVD) method instead of the thermal oxidation.

Next, the elastic body layer 241 is patterned. Specifically, a step that is convex to the pressure chamber substrate 34 is formed at a central portion (portion corresponding to the first region Ar1 described above) of the elastic body layer 241 in the X-axis direction by using well-known processing techniques such as forming a resist Pr using photolithography, etching, and peeling the resist Pr. More specifically, a surface of the end portion of the elastic body layer 241 is shaved such that a thickness of the end portion of the central portion on the outer side in the X-axis direction (the portion corresponding to the above-described second regions Ar2) is smaller than a thickness of the central portion. The thickness of the end portion of the elastic body layer 241 is preferably 500 nanometers, for example. It should be noted that the etching may be liquid etching using an etching solution containing hydrogen fluoride (HF) or dry etching.

Next, the surface of the elastic body layer 241 is etched to smooth the surface. Specifically, a corner portion of the step formed by patterning the elastic body layer 241 and a surface of a portion where the resist Pr is mounted are processed to be smooth. At this time, it is preferable that the elastic body layer 241 is formed to have a thickness of, for example, 1700 nanometers at the central portion and 400 nanometers at the end portion.

Next, the insulation layer 242 is formed by the CVD method on the surface of the elastic body layer 241 on which the step is formed. It is preferable that the insulation layer 242 is formed to have a thickness of 100 nanometers. In this way, the vibration plate 24 is formed on the surface of the pressure chamber substrate 34.

Figure 7:
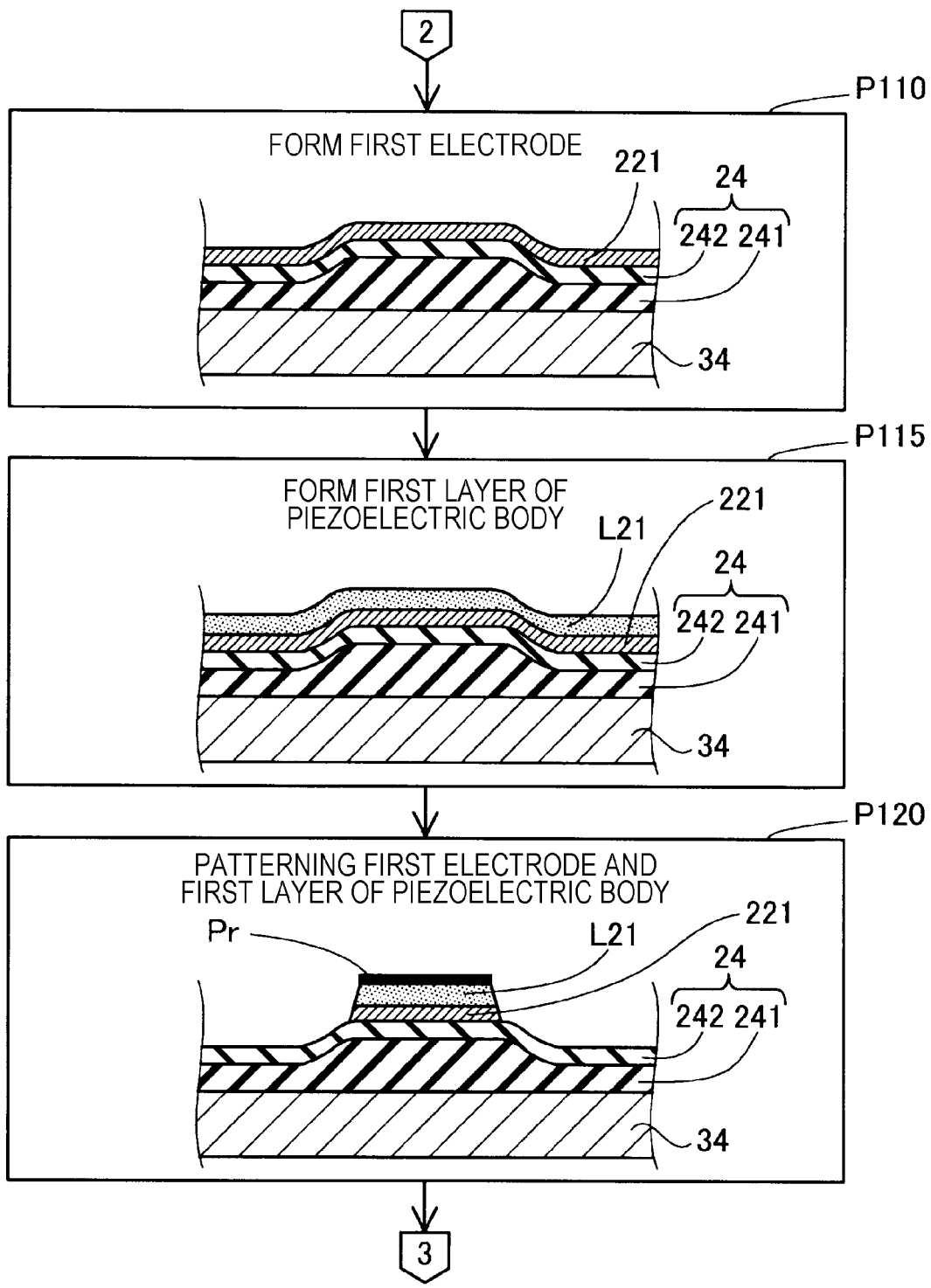
FIG. 7 is a process diagram illustrating a method of manufacturing a liquid discharging head.

As shown in FIG. 7, in process P110, the first electrode 221 is formed on a surface of the vibration plate 24 in the +Z direction. Specifically, the first electrode 221 is formed by sputtering using platinum as a target material. The first electrode 221 may be formed to have a thickness of 200 nanometers.

In process P115, a first layer L21 of the piezoelectric body 220 is formed on a surface of the first electrode 221 in the +Z direction. The piezoelectric body 220 is formed by using a sol-gel method. Specifically, a surface of the first electrode 221 is spin-coated with a solution prepared by dissolving an organometallic compound containing lead (Pb), zirconium (Zr), and titanium (Ti) as a base material of the piezoelectric body 220 in a solvent, and then calcined for solidification. Thereby, one layer of lead zirconate titanate (PZT) is formed. It is preferable that the first layer L21 of the piezoelectric body 220 is formed to have a thickness of 200 nanometers.

In process P120, the first electrode 221 and the first layer L21 of the piezoelectric body 220 are patterned. Process P120 is performed by the same procedure as the patterning of the elastic body layer 241 of vibration plate 24 in process P105 described above. At this time, the surfaces of the first electrode 221 and the piezoelectric body 220 are processed such that a shape of the first electrode 221 and the first layer L21 of the piezoelectric body 220 becomes the tapered shape in which the dimension in the X-axis direction increases from the +Z direction toward the −Z direction.

Figure 8:
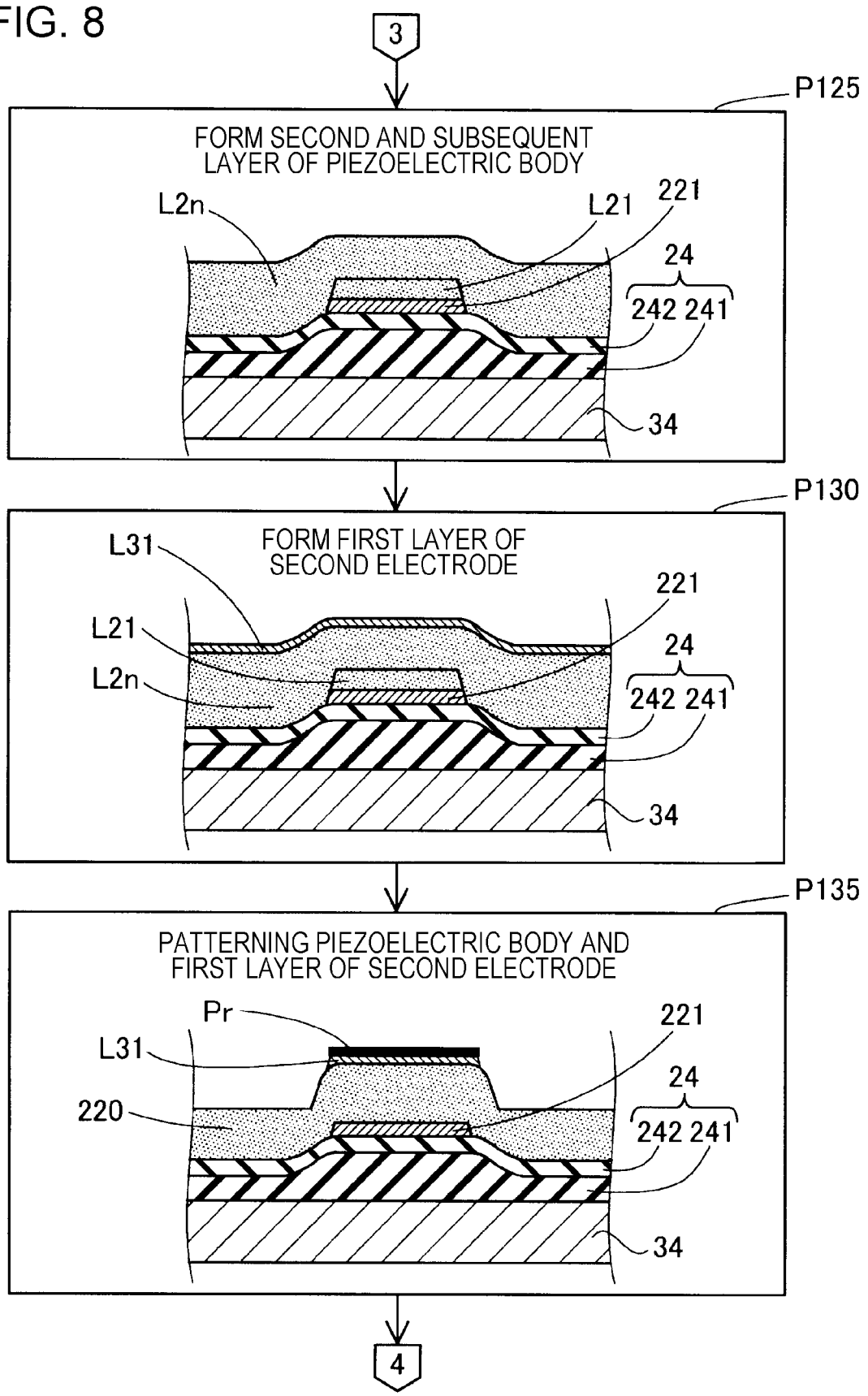
FIG. 8 is a process diagram illustrating a method of manufacturing a liquid discharging head.

As shown in FIG. 8, in process P125, a second and subsequent layer L2n of the piezoelectric body 220 are formed. Process P125 is performed by the same procedure as process P115 described above. Specifically, a plurality of layers of lead zirconate titanate is formed on the surface of the vibration plate 24 in the +Z direction with the formed step and on the surface of the first layer L21 of the piezoelectric body 220 in the +Z direction by spin-coating and repeatedly calcining for solidification of the above-mentioned solution multiple times, and then calcined for crystallization. By repeatedly executing such a process until a predetermined thickness is obtained, a plurality of layers of the piezoelectric body 220 is stacked. It is preferable that the piezoelectric body 220 is formed to have a thickness of 1000 nanometers.

In process P130, a first layer L31 of the second electrode 222 is formed on the surface of the piezoelectric body 220 in the +Z direction. Specifically, the second electrode 222 is formed by sputtering using platinum as a target material. It is preferable that the first layer L31 of the second electrode 222 is formed to have a thickness of 10 nanometers.

In process P135, the piezoelectric body 220 and the first layer L31 of the second electrode 222 are patterned. The patterning is performed by the same procedure as the above-mentioned processes P105 and P120. In process P135, the surface of the end portion of the piezoelectric body 220 is shaved such that a shape of the central portion of the piezoelectric body 220 in the X-axis direction becomes the tapered shape in which the dimension in the X-axis direction increases from the +Z direction toward the −Z direction. In addition, the end portion of the second electrode 222 is peeled from the surface of the piezoelectric body 220 in the +Z direction such that the second electrode 222 is disposed only at the central portion in the X-axis direction, that is, only at a position corresponding to the first electrode 221 in the Z-axis direction. It is preferable that the end portion of the piezoelectric body 220 is formed to have a thickness of 600 nanometers. It should be noted that in process P135, the second electrode 222 may be annealed.

Figure 9:
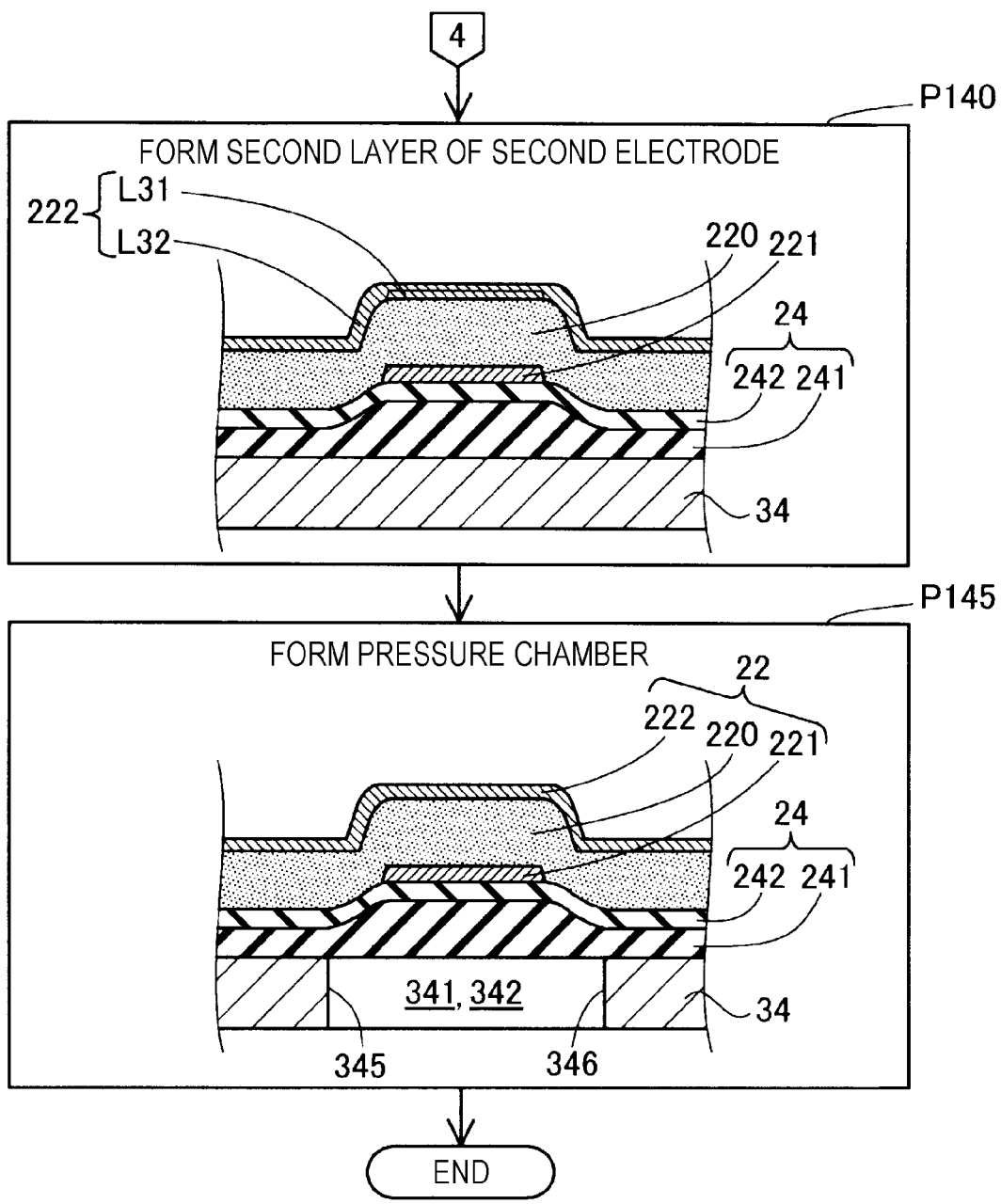
FIG. 9 is a process diagram illustrating a method of manufacturing a liquid discharging head.

As shown in FIG. 9, in process P140, a second layer L32 of the second electrode 222 is formed on the surface of the piezoelectric body 220 in the +Z direction and the surface of the first layer L31 of the second electrode 222 in the +Z direction. Process P140 is performed by the same procedure as the process P130 described above. It is preferable that the second layer L32 of the second electrode 222 is formed to have a thickness of 30 nanometers.

In process P145, the pressure chamber forming portion 342 is formed on the pressure chamber substrate 34. The formation of the pressure chamber forming portion 342 is executed by using well-known processing techniques such as forming a resist Pr using photolithography, etching, and peeling the resist.

Although illustration is omitted, after the process P145, the liquid discharging head 26 is manufactured by the following procedure. Specifically, the flow path substrate 32 in which the groove constituting the opening portion 322, the supply flow path 324, the communication flow path 326, and the relay flow path 328 is formed in advance is bonded to the pressure chamber substrate 34. The formation of the opening portion 322 and the like is executed by using the same well-known processing technique as the formation of the supply flow path 324 described above. Bonding between the flow path substrate 32 and the pressure chamber substrate 34 may be executed using an adhesive, for example. Next, the nozzle plate 46 and the vibration absorber 48 are bonded to the flow path substrate 32. Next, the casing portion 42 in which the accommodating portion 422 and the inlet 424 are formed in advance is bonded to the surface of the flow path substrate 32 in the +Z direction. Next, the sealing body 44 is bonded to the surface of the vibration plate 24 in the +Z direction. Next, the wiring substrate 90 is bonded to the surface of the vibration plate 24 in the +Z direction. In this way, the liquid discharging head 26 is completed.

When manufacturing the liquid discharging apparatus 100 including the liquid discharging head 26, the wiring substrate 90 is coupled to the control unit 80, and the inlet 424 is coupled to the tube 52.

According to the liquid discharging head 26 of the present embodiment described above, when the central region in the pressure chamber 341 in the X-axis direction is assumed as the first region Ar1 and the region at the end portion of the first region Ar1 on the outer side in the X-axis direction is assumed as the second regions Ar2, since both the piezoelectric body 220 and the vibration plate 24 are provided in the first region Ar1 and the second regions Ar2, compared to a configuration in which both the piezoelectric body 220 and the vibration plate 24 are provided in the first region Ar1 and only the piezoelectric body 220 is provided in the second regions Ar2, when the piezoelectric body 220 is deformed, stress is concentrated on the vibration plate 24 in the vicinity of the boundary between the first region Ar1 and the second regions Ar2 and occurrence of cracks can be suppressed in the vibration plate 24. In addition, according to the liquid discharging head 26 of the embodiment, since the thickness d2 of the vibration plate 24 in the second regions Ar2 is smaller than the thickness d1 of the vibration plate 24 in the first region Ar1, the neutral axis in the first region Ar1 can be disposed at a position closer to the vibration plate 24 side than the piezoelectric body 220, and the neutral axis in the second regions Ar2 can be disposed at a position closer to the piezoelectric body 220 side than the vibration plate 24. Therefore, a neutral surface of the vibration plate 24, that is, a portion where the vibration plate 24 is not loaded when a bending moment is applied to the vibration plate 24 by the piezoelectric body 220, is located on the piezoelectric body 220 side in the first region Ar1, and is located on the vibration plate 24 side in the second regions Ar2. Therefore, in the first region Ar1 and the second regions Ar2, a portion that is not affected by the stress when the piezoelectric body 220 is deformed can be disposed at different positions, so that the rigidity of the vibration plate 24 as a whole can be increased.

Since the sum of the thickness d2 of the vibration plate 24 and the thickness d5 of the piezoelectric body 220 in the second regions Ar2 is smaller than the sum of the thickness d1 of the vibration plate 24 and the thickness d4 of the piezoelectric body 220 in the first region Ar1, the thickness in the first region Ar1 can be made larger than the thickness in the second region Ar2, in the same manner as a case of focusing only on the thickness of the vibration plate 24 or a case of focusing only on the thickness of the piezoelectric body 220, even when focusing on the total thickness of the vibration plate 24 and the piezoelectric body 220.

Since the thickness d5 of the piezoelectric body 220 in the second regions Ar2 is smaller than the thickness d4 of the piezoelectric body 220 in the first region Ar1, it is possible to suppress a decrease in the deformation efficiency of the piezoelectric body 220, as compared with a configuration in which the first region Ar1 and the second regions Ar2 are provided with piezoelectric bodies having the same thickness.

Since the difference between the thickness d2 of the vibration plate 24 and the thickness d5 of the piezoelectric body 220 in the second regions Ar2 is smaller than the difference between the thickness d1 of the vibration plate 24 and the thickness d4 of the piezoelectric body 220 in the first region Ar1, the neutral axis in the second regions Ar2 can be disposed at a position closer to the piezoelectric body 220 side than the vibration plate 24.

Since the sum of the thickness d2 of the vibration plate 24 and the thickness d5 of the piezoelectric body 220 in the second regions Ar2 is larger than the thickness d1 of the vibration plate 24 in the first region Ar1 and is also larger than the thickness d4 of the piezoelectric body 220, the total thickness of the vibration plate 24 and the piezoelectric body 220 in the second regions Ar2 can be larger than the thickness d1 of the vibration plate 24 in the first region Ar1 and the thickness d4 of the piezoelectric body 220 in the first region Ar1, respectively.

Since the end portion E5 of the vibration plate 24 in the −Z direction in the second regions Ar2 is disposed at the same position as the end portion E5 of the vibration plate 24 in the −Z direction in the first region Ar1, and the end portion E3 of the vibration plate 24 in the second regions Ar2 in the +Z direction is disposed in the −Z direction from the end portion E1 of the vibration plate 24 in the first region Ar1 in the +Z direction, the thickness of the vibration plate 24 can be formed in the +Z direction of the vibration plate 24. Therefore, it is possible to suppress a decrease in the physical degree of adhesion between the vibration plate 24 and the pressure chamber substrate 34.

Since the thickness d22 of the insulation layer 242 in the second regions Ar2 is equal to the thickness d12 of the insulation layer 242 in the first region Ar1, and the thickness d21 of the elastic body layer 241 in the second regions Ar2 is smaller than the thickness d11 of the elastic body layer 241 in the first region Ar1, the total thickness of the vibration plate 24 can be made different between the first region Ar1 and the second regions Ar2 by making the thickness of the elastic body layer 241 different between the first region Ar1 and the second region Ar2.

Since the insulation layer 242 is made of zirconium oxide, the mechanical strength of the vibration plate 24 can be improved.

Since a plurality of pressure chambers 341 have the first electrode 221 provided individually and the second electrode 222 provided commonly, a configuration for separately controlling the plurality of pressure chambers 341 and a configuration for collectively controlling the plurality of pressure chambers 341 can be easily realized by separately driving and controlling the first electrode 221 and the second electrode 222.

Since the piezoelectric body 220 is driven by applying different drive voltages to the first electrode 221 according to the discharge amount of ink and applying a constant holding voltage to the second electrode 222 regardless of the discharge amount of ink, a potential difference can be generated between the first electrode 221 and the second electrode 222. Therefore, since the piezoelectric body 220 can be deformed by the potential difference, pressure can be applied to the ink accommodated in the pressure chamber 341.

When a position overlapping the partition wall 345 in the X-axis direction is assumed as the third position P3, both the piezoelectric body 220 and the vibration plate 24 are provided in the third position P3, and since the thickness d3 of the vibration plate 24 in the third position P3 is smaller than the thickness d1 of the vibration plate 24 in the first region Ar1, a position of the neutral axis in the third position P3 can be disposed at a position closer to the vibration plate 24 side than a position of the neutral axis in the first region Ar1.

Since the first region Ar1 is the central portion in the pressure chamber 341 in the X-axis direction and the second regions Ar2 is the end portion in the pressure chamber 341 in the X-axis direction, the position of the neutral surface of the vibration plate 24 can be made different between the central portion and the end portion in the pressure chamber 341 in the X-axis direction. Therefore, even in a case where stress is concentrated in the vicinity of the boundary between the central portion and the end portion when the piezoelectric body 220 is deformed, the occurrence of the cracks can be suppressed in the vibration plate 24 in the vicinity of the boundary.

According to the method of manufacturing the liquid discharging head 26 of the present embodiment described above, the elastic body layer 241 is formed on a surface of the pressure chamber substrate 34 in the +Z direction, and the formed elastic body layer 241 is etched. Therefore, a step is formed such that the central portion of the X-axis direction is convex with respect to the pressure chamber substrate 34, and the piezoelectric body 220 is formed in the +Z direction of the elastic body layer 241 on which the step is formed, so that the piezoelectric body 220 can be formed such that the central portion of the piezoelectric body 220 in the X-axis direction is convex with respect to the pressure chamber substrate 34. In addition, since the step is formed such that the thickness of the elastic body layer 241 at the central portion in the X-axis direction is larger than the thickness of the elastic body layer 241 at the end portion in the X-axis direction, it is possible to easily form the vibration plate 24 in which the thickness of the central portion in the X-axis direction is larger than the thickness of the end portion in the X-axis direction.

B. Second Embodiment

Figure 10:
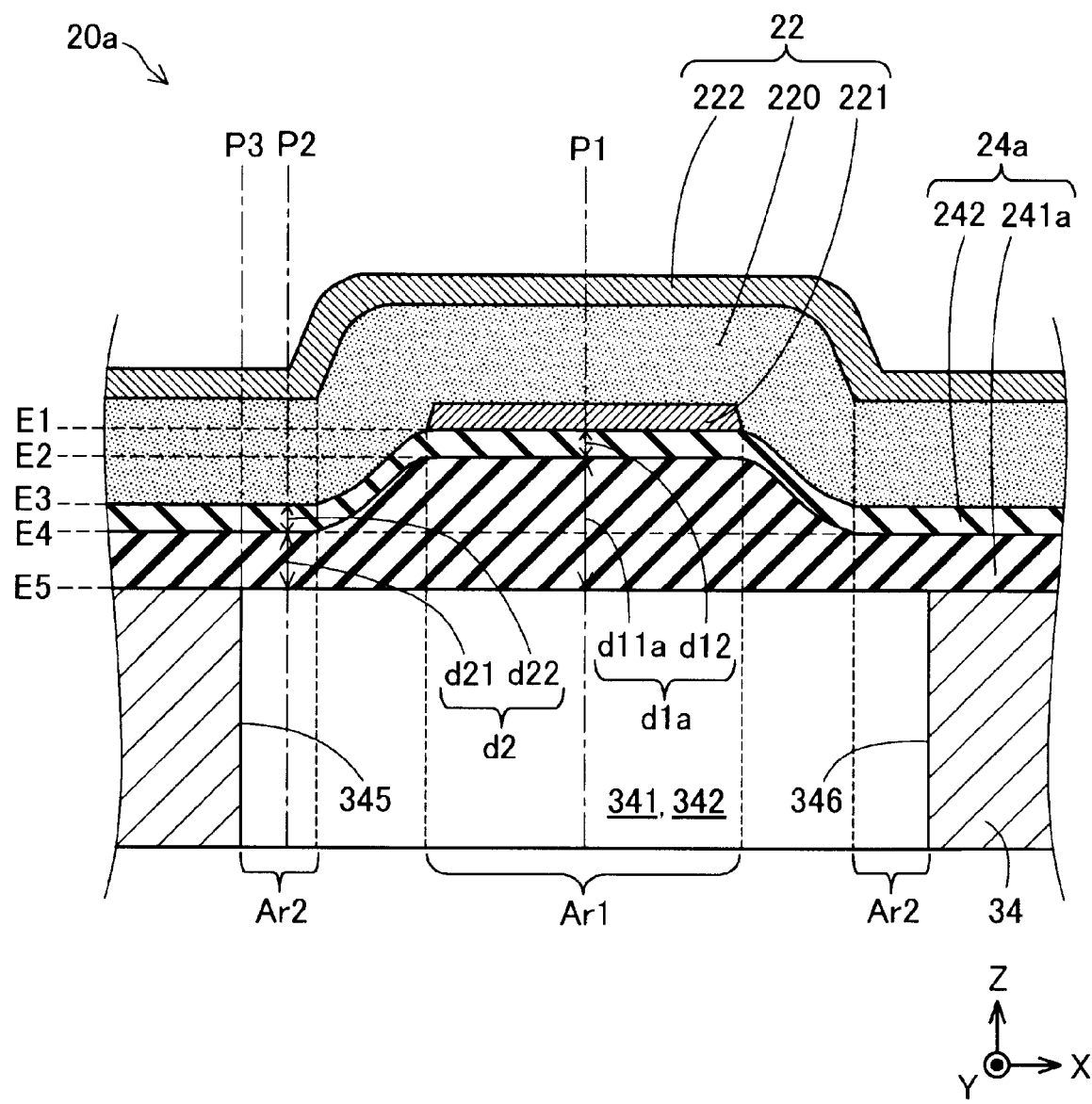
FIG. 10 is a sectional view schematically illustrating a detailed configuration of a piezoelectric actuator according to a second embodiment.

In the following, the same configuration as those in the above-described first embodiment will be denoted by the same reference numerals, and description thereof will be omitted. FIG. 10 is a cross-sectional view schematically illustrating a detailed configuration of a piezoelectric actuator 20a included in the liquid discharging head according to the second embodiment. FIG. 10 shows a configuration corresponding to the configuration of the piezoelectric actuator 20 illustrated in FIG. 4. It should be noted that the same applies to the FIGS referred to later. The piezoelectric actuator 20a according to the second embodiment is different from the piezoelectric actuator 20 according to the first embodiment in that a vibration plate 24a is provided instead of the vibration plate 24. The vibration plate 24a is different from the vibration plate 24 of the first embodiment in that the elastic body layer 241a is provided instead of the elastic body layer 241.

As can be understood by comparing FIGS. 4 and 5 with FIG. 10, in the first region Ar1, a thickness d1a of the vibration plate 24a at the first position P1 is larger than the thickness d1 of the vibration plate 24 of the first embodiment. Specifically, a thickness d11a of the elastic body layer 241a at the first position P1 is larger than the thickness d11 of the elastic body layer 241 of the first embodiment. In the present embodiment, the thickness d11a of the elastic body layer 241a at the first position P1 is made larger than the thickness d11 of the first embodiment by making the thickness of the elastic body layer 241a larger in the +Z direction than the end portion E4 of the elastic body layer 241a at the second position P2 in the +Z direction. The thickness d11a of the elastic body layer 241a at the first position P1 is larger than the thickness d21 of the elastic body layer 241a at the second position P2. In addition, the thickness d11a of the elastic body layer 241a at the first position P1 is larger than the thickness d22 of the insulation layer 242 at the second position P2. Therefore, also in the second embodiment, the thickness d2 of the vibration plate 24a in the second regions Ar2 is smaller than the thickness d1a of the vibration plate 24a in the first region Ar1.

The piezoelectric actuator 20a of the second embodiment can be formed by omitting the patterning of the elastic body layer 241a in process P105 illustrated in FIG. 6. Therefore, it is possible to reduce unevenness in a displacement amount of the vibration plate 24a caused by the etching of the elastic body layer 241a.

C. Third Embodiment

Figure 11:
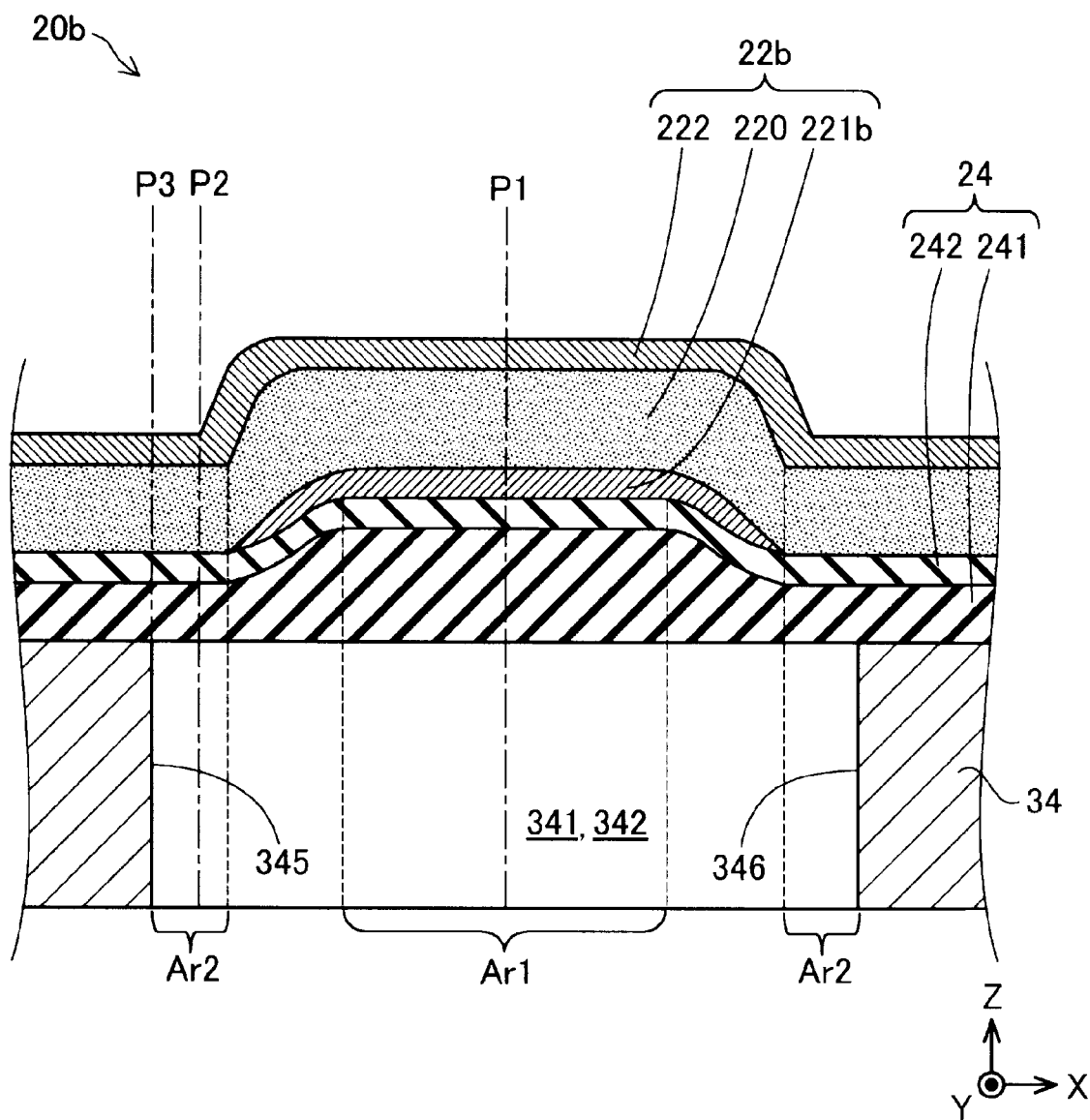
FIG. 11 is a sectional view schematically illustrating a detailed configuration of a piezoelectric actuator according to a third embodiment.

FIG. 11 is a cross-sectional view schematically illustrating a detailed configuration of a piezoelectric actuator 20b included in the liquid discharging head according to the third embodiment. The piezoelectric actuator 20b of the third embodiment is different from the piezoelectric actuator 20 of the first embodiment in that a piezoelectric portion 22b is provided instead of the piezoelectric portion 22. The piezoelectric portion 22b is different from the piezoelectric portion 22 of the first embodiment in that a first electrode 221b is provided instead of the first electrode 221. The first electrode 221b is different in a shape and a length in the X-axis direction from the first electrode 221 of the first embodiment.

The first electrode 221b covers the +Z direction of the vibration plate 24 in the first region Ar1, and covers the +Z direction of the vibration plate 24 in a portion sandwiched between the first region Ar1 and the second regions Ar2 in the X-axis direction. That is, the first electrode 221b covers an outer shape of a convex portion of the vibration plate 24 protruding in the +Z direction. The first electrode 221b has a larger length (width) in the X-axis direction than the first electrode 221 of the first embodiment. The end portion of the first electrode 221b in the −X direction is disposed at the same position as the end portion of the second regions Ar2 in the +X direction located in the −X direction of the first region Ar1, and the end portion of the first electrode 221b in the +X direction is disposed at the same position as the end portion of the second regions Ar2 in the −X direction located in the +X direction of the first region Ar1. Therefore, the first electrode 221b covers the vicinity of the boundary between the first region Ar1 and the second region Ar2. For this reason, since the first electrode 221b can protect the vibration plate 24 in the vicinity of the boundary, the occurrence of the cracks can be suppressed in the vibration plate 24 when the piezoelectric body 220 is deformed.

The piezoelectric actuator 20b of the third embodiment can be formed by preparing and patterning a mask pattern having the same shape as the shape of the first electrode 221b in process P120 illustrated in FIG. 7.

D. Fourth Embodiment

Figure 12:
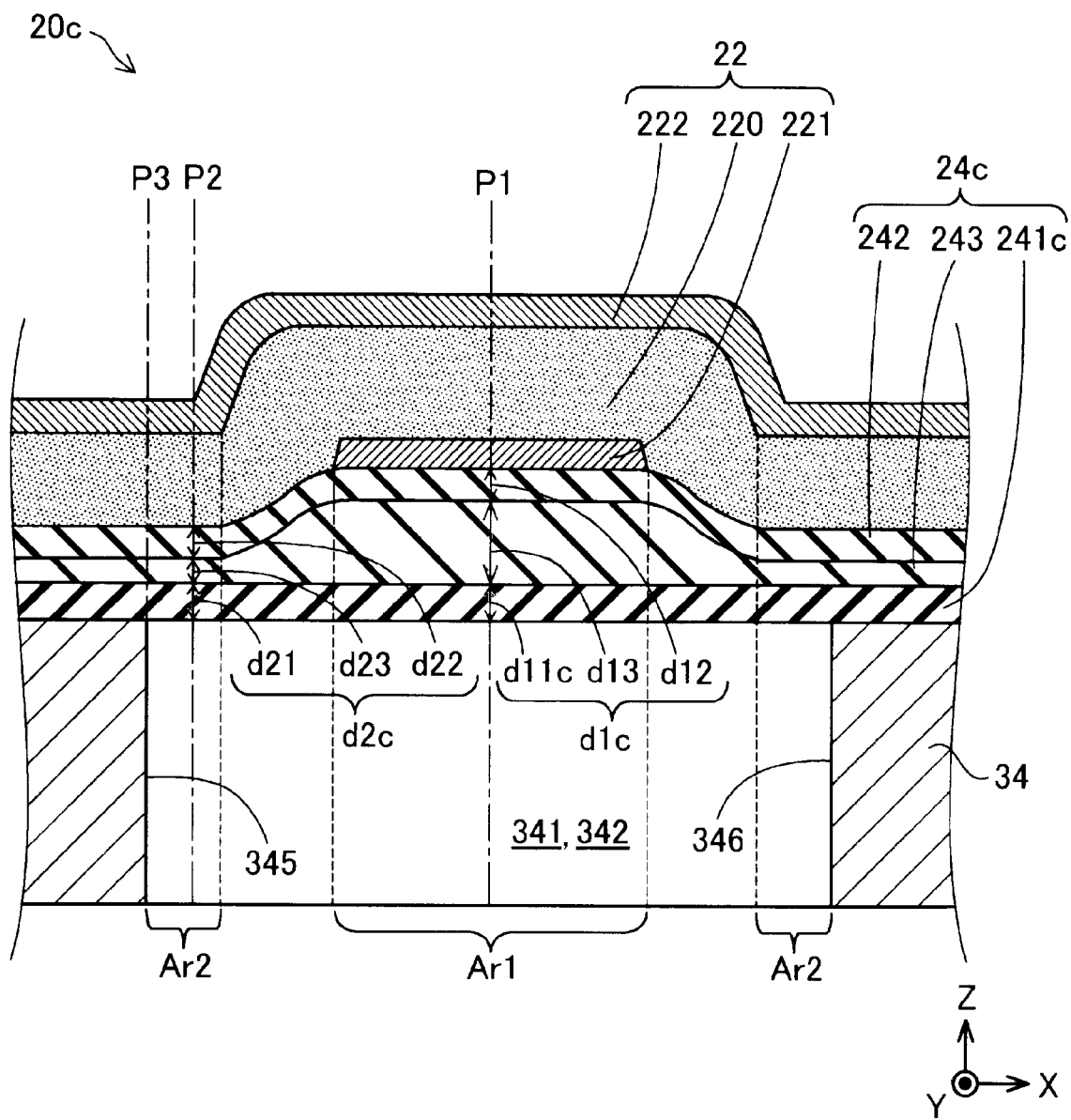
FIG. 12 is a sectional view schematically illustrating a detailed configuration of a piezoelectric actuator according to a fourth embodiment.

FIG. 12 is a cross-sectional view schematically illustrating a detailed configuration of a piezoelectric actuator 20c included in the liquid discharging head according to the fourth embodiment. The piezoelectric actuator 20c according to the fourth embodiment is different from the piezoelectric actuator 20 according to the first embodiment in that a vibration plate 24c is provided instead of the vibration plate 24. The vibration plate 24c is different from the vibration plate 24 of the first embodiment in that an elastic body layer 241c is provided instead of the elastic body layer 241, and an adhesion layer 243 is additionally provided.

In the first embodiment, a surface of the elastic body layer 241 in the +Z direction is formed in a convex shape protruding in the +Z direction. On the other hand, the elastic body layer 241c of the fourth embodiment is parallel to the X-axis direction, similarly to the surface in the −Z direction. Therefore, a thickness of the elastic body layer 241c is constant in the X-axis direction. That is, a thickness d11c of the elastic body layer 241c in the first region Ar1 is equal to the thickness d21 of the elastic body layer 241c in the second region Ar2.

The adhesion layer 243 is provided between the elastic body layer 241c and the insulation layer 242. Specifically, the adhesion layer 243 is disposed on the surface of the elastic body layer 241c in the +Z direction, and the insulation layer 242 is disposed on the surface of the adhesion layer 243 in the +Z direction. The adhesion layer 243 is formed of, for example, titanium oxide ($TiO_2$) or aluminum oxide ($Al_2O_3$). Similarly to the elastic body layer 241 of the first embodiment illustrated in FIG. 4, the adhesion layer 243 is formed such that the surface of the first region Ar1 becomes the convex shape slightly protruding in the +Z direction from the surface of the second regions Ar2 in the +Z direction. Therefore, a thickness d23 of the adhesion layer 243 in the second regions Ar2 is smaller than a thickness d13 of the adhesion layer 243 in the first region Ar1.

Therefore, also in the fourth embodiment, a thickness d2c of the vibration plate 24c in the second regions Ar2 is smaller than a thickness d1c of the vibration plate 24c in the first region Ar1.

In process P 105 illustrated in FIG. 6, the piezoelectric actuator 20c according to the fourth embodiment omits patterning of the elastic body layer 241 when the elastic body layer 241c is formed on the surface of the pressure chamber substrate 34, and forms the adhesion layer 243 on the surface of the formed elastic body layer 241c in the +Z direction by thermal oxidation or CVD. Then, the formed adhesion layer 243 is patterned. The patterning of the adhesion layer 243 may use the same mask pattern as that used for patterning the elastic body layer 241 of the first embodiment. Next, the insulation layer 242 is formed on the adhesion layer 243. In this way, the vibration plate 24c including the adhesion layer 243 is formed.

According to the liquid discharging head of the fourth embodiment described above, the thickness of the insulation layer 242 in the second regions Ar2 is equal to d22 and the thickness d12 of the insulation layer 242 in the first region Ar1, the thickness d21 of the elastic body layer 241c in the second regions Ar2 is equal to the thickness d11c of the elastic body layer 241c in the first region Ar1, and the thickness d23 of the adhesion layer 243 in the second regions Ar2 is smaller than the thickness d13 of the adhesion layer 243 in the first region Ar1. Therefore, the total thickness of the vibration plate 24c can be made different between the first region Ar1 and the second regions Ar2 by making the thickness of the adhesion layer 243 different between the first region Ar1 and the second region Ar2.

E. Fifth Embodiment

Figure 13:
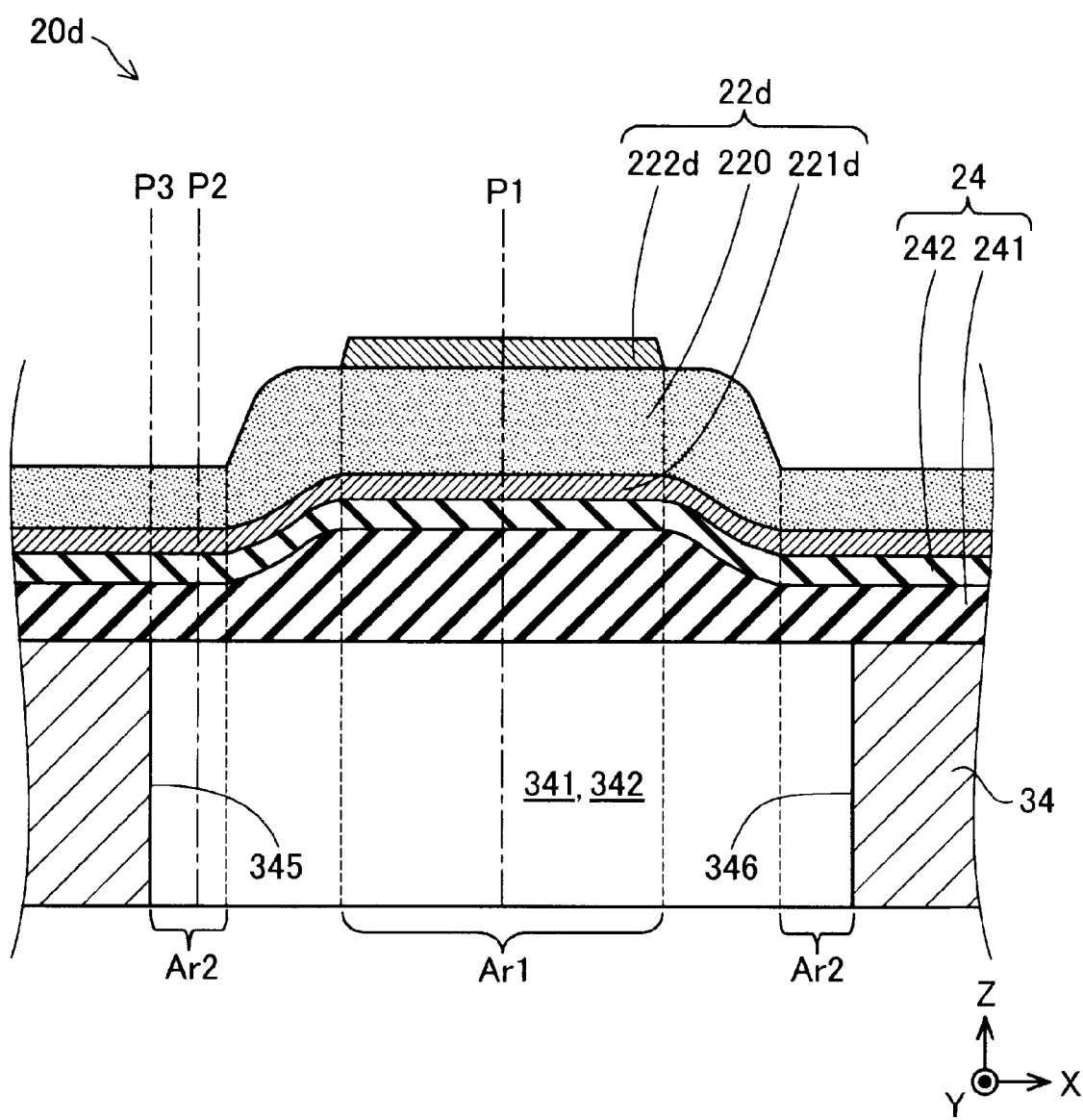
FIG. 13 is a sectional view schematically illustrating a detailed configuration of a piezoelectric actuator according to a fifth embodiment.

FIG. 13 is a cross-sectional view schematically illustrating a detailed configuration of a piezoelectric actuator 20d included in the liquid discharging head according to the fifth embodiment. The piezoelectric actuator 20d of the fifth embodiment is different from the piezoelectric actuator 20 of the first embodiment in that a piezoelectric portion 22d is provided instead of the piezoelectric portion 22. The piezoelectric portion 22d is different from the piezoelectric portion 22 of the first embodiment in that a first electrode 221d is provided instead of the first electrode 221, and a second electrode 222d is provided instead of the second electrode 222.

In the first embodiment, the first electrode 221 is an individual electrode and the second electrode 222 is a common electrode. On the other hand, in the fifth embodiment, the first electrode 221d is a common electrode and the second electrode 222d is an individual electrode. The first electrode 221d is coupled to the wiring substrate 90 by common wiring, and the second electrode 222d is respectively coupled to the wiring substrate 90 by individual wiring. The first electrode 221d is provided on a surface of the insulation layer 242 of the vibration plate 24 in the +Z direction, and covers the outer shape of the insulation layer 242 over the entire region of the X-axis direction. The second electrode 222d is provided on a surface of the piezoelectric body 220 in the first region Ar1 in the +Z direction, and is formed in the tapered shape in which the dimension in the X-axis direction increases from the +Z direction toward the −Z direction.

The piezoelectric actuator 20d of the fifth embodiment can be formed by the following procedure. Specifically, the first electrode 221d can be formed by omitting the patterning of the first electrode 221d in the above process P120. That is, the first electrode 221d is formed in the above process P110, the first layer L21 of the piezoelectric body 220 is formed in the above process P115, and only the piezoelectric body 220 is patterned in the above process P120. In addition, the second electrode 222d can be formed by exchanging the execution order of the above process P135 and the above process P140. That is, the first layer L31 of the second electrode 222d is formed in the above process P130, the second layer L32 of the second electrode 222d is formed in the above process P140, and the piezoelectric body 220 and the second electrode 222d are patterned in the above process P135. In this way, the piezoelectric portion 22d in which the first electrode 221d is a common electrode and the second electrode 222d is an individual electrode is formed.

According to the liquid discharging head of the fifth embodiment described above, since a plurality of pressure chambers 341 have the second electrode 222d provided individually and the first electrode 221d provided commonly, a configuration for separately controlling the plurality of pressure chambers 341 and a configuration for collectively controlling the plurality of pressure chambers 341 can be easily realized by separately driving and controlling the first electrode 221d and the second electrode 222d.

F. Other Embodiment (F1) In each of the above embodiments, the first region Ar1 is a region in the central portion of the pressure chamber 341 in the X-axis direction, and the second regions Ar2 is a region in the end portion of the pressure chamber 341 in the X-axis direction, but the present disclosure is not limited to this. Specifically, the first region Ar1 may be a region closer to the end portion than the central portion in the pressure chamber 341 in the X-axis direction, for example, a region corresponding to a portion of the piezoelectric body 220, which is formed in the tapered portion, and the second regions Ar2 may be a region including a position closer to the partition walls 345 and 346 than the first region Ar1. That is, in general, the configuration may be such that the first region Ar1 is a randomly region in the pressure chamber 341 in the X-axis direction and the second regions Ar2 is a region outside the first region Ar1 in the X-axis direction.

(F2) In each of the above embodiments, the first position P1 is the central position in the X-axis direction in the pressure chamber 341, but the first position P1 is not limited to the central position and may be any position in the pressure chamber 341 in the X-axis direction. At this time, the second position P2 may be any other position as long as it is a position closer to the partition walls 345, 346 in the pressure chamber 341 than the first position P1.

(F3) In each of the above embodiments, the thickness d5 of the piezoelectric body 220 in the second regions Ar2 may be larger than the thickness d4 of the piezoelectric body 220 in the first region Ar1.

(F4) In each of the above embodiments, the sum of the thickness d2 of the vibration plate 24 and the thickness d5 of the piezoelectric body 220 in the second regions Ar2 may not be smaller than the sum of the thickness d1 of the vibration plate 24 and the thickness d4 of the piezoelectric body 220 in the first region Ar1.

(F5) In each of the above embodiments, the difference of the thickness d2 of the vibration plate 24 and the thickness d5 of the piezoelectric body 220 in the second regions Ar2 may not be smaller than the difference of the thickness d1 of the vibration plate 24 and the thickness d4 of the piezoelectric body 220 in the first region Ar1.

(F6) In each of the above embodiments, the sum of the thickness d2 of the vibration plate 24 and the thickness d5 of the piezoelectric body 220 in the second regions Ar2 may be a value equal to or less than the thickness d1 of the vibration plate 24 in the first region Ar1 or a value equal to or less than the thickness d4 of the piezoelectric body 220.

(F7) In each of the above embodiments, the thickness d5 of the piezoelectric body 220 may not be larger than the thickness d1 of the vibration plate 24 in the second region Ar2.

(F8) In each of the above embodiments, the end portion E1 of the vibration plate 24 in the second regions Ar2 in the +Z direction may not be disposed in the −X direction more than the end portion E3 of the vibration plate 24 in the first region Ar1 in the +Z direction.

(F9) In each of the above embodiments, the thickness d22 of the insulation layer 242 in the second regions Ar2 may not be equal to the thickness d12 of the insulation layer 242 in the first region Ar1. In addition, the thickness d21 of the elastic body layer 241 in the second regions Ar2 may not be smaller than the thickness d11 of the elastic body layer 241 in the first region Ar1.

(F10) In the fourth embodiment, the thickness d22 of the insulation layer 242 in the second regions Ar2 may not be equal to the thickness d12 of the insulation layer 242 in the first region Ar1. In addition, the thickness d21 of the elastic body layer 241 in the second regions Ar2 may not be equal to the thickness d11c of the elastic body layer 241c in the first region Ar1. Further, the thickness d23 of the adhesion layer 243 in the second regions Ar2 may not be smaller than the thickness d13 of the adhesion layer 243 in the first region Ar1.

(F11) In each of the above embodiments, the elastic body layer 241 is made of silicon dioxide and the insulation layer 242 is made of zirconium oxide, but both the elastic body layer 241 and the insulation layer 242 may be made of silicon dioxide, and both the elastic body layer 241 and the insulation layer 242 may be made of zirconium oxide.

(F12) In the first embodiment, the thickness d3 of the vibration plate 24 at the third position P3 may not be smaller than the thickness d1 of the vibration plate 24 in the first region Ar1.

(F13) In each of the above embodiments, a liquid ejected from the nozzle N may be a liquid other than ink. The following are examples.

(1) Coloring materials used for manufacturing color filters for image display apparatus such as liquid crystal displays
(2) Electrode materials used for forming electrodes such as organic electro luminescence (EL) displays and surface emission displays (field emission display (FED))
(3) Liquids containing living organic materials used for manufacturing biochips
(4) Samples as a precision pipette
(5) Lubricating oils
(6) Resin solutions
(7) Transparent resin solutions such as an ultraviolet curable resin solution for forming a hemispherical microlens (optical lens) used in an optical communication element or the like
(8) Liquids that eject an acidic or alkaline etching solution to etch a substrate or the like
(9) Any other minute amount of droplets It should be noted that the "droplet" refers to the state of a liquid ejected from the liquid discharging apparatus 100, and also includes those having a granule state, a tear-like state, and a tailing filiform state. In addition, the "liquid" referred to here may be any material that can be consumed by the liquid discharging apparatus 100. For example, the "liquid" may be any material as long as the material is in a liquid state, and also includes materials in a liquid state having high or low viscosity and materials in a liquid state such as sols, gel water, other inorganic and organic solvents, solutions, liquid resins, and liquid metals (metal melts). In addition, "liquid" includes not only a liquid as a state of materials, but also materials in which particles of a functional material consisting of solid matters such as pigments and metal particles are dissolved, dispersed or mixed in a solvent. Typical examples of the liquid include ink and liquid crystal. Here, the ink includes various liquid compositions such as general water-based ink, oil-based ink, gel ink, and hot melt ink. Also in these configurations, the same effect as each embodiment is achieved.

(F14) In each of the above embodiments, the thickness of the vibration plate 24 and the thickness of the piezoelectric body 220 made different between the first region Ar1 and the second region Ar2, but the present disclosure is not limited to this. Specifically, in the entire first region Ar1 or the entire second region Ar2, a size relationship of the thickness of the vibration plate 24 and a size relationship of the thickness of the piezoelectric body 220 may not be satisfied. At least, when the thickness of the vibration plate 24 and the thickness of the piezoelectric body 220 at the first position P1 and the thickness of the vibration plate 24 and the thickness of the piezoelectric body 220 at the second position P2 satisfy the above-mentioned size relation of the thickness of the vibration plate 24 and the above-mentioned size relation of the thickness of the piezoelectric body 220, the same effect as each embodiment is achieved. In addition, neither the size relation of the thickness of the vibration plate 24 nor the size relation of the thickness of the piezoelectric body 220 may not be satisfied, and at least the thickness of the vibration plate 24 at the first position P1 and the thickness of the vibration plate 24 at the second position P2 may be satisfied the size relation of the thickness of the vibration plate 24 described above.

The present disclosure is not limited to the above-described embodiments, and can be realized in various configurations within a range not departing from the spirit of the present disclosure. For example, the technical features in the embodiments corresponding to the technical features in each embodiment described in the column of the SUMMARY can be replaced or combined as appropriate to solve some or all of the problems of the disclosure or to achieve some or all of the effects described above. In addition, if the technical features are not described as essential in the present specification, they may be deleted as appropriate.

G. Another Embodiment (1) According to an embodiment of the present disclosure, the liquid discharging head is provided. According to an aspect of the present disclosure, the liquid discharging head includes a piezoelectric body, a vibration plate provided on one side in a first direction with respect to the piezoelectric body, and a pressure chamber substrate provided on the one side with respect to the vibration plate, the pressure chamber substrate including a plurality of partition walls that partition a pressure chamber for applying a pressure to a liquid, the piezoelectric body, the vibration plate, and the pressure chamber substrate being provided side by side in the first direction, in which in two positions in a second direction intersecting with the first direction in the pressure chamber, when one position where a distance in the second direction to the partition wall located at a nearest position in the second direction is long is assumed as a first position, and the other position where the distance is short is assumed as a second position, both the piezoelectric body and the vibration plate are provided at the first position and the second position, and a thickness of the vibration plate at the second position is smaller than a thickness of the vibration plate at the first position.

According to the liquid discharging head of the embodiment, in two positions in the second direction intersecting with the first direction in the pressure chamber, when one position where the distance in the second direction to the partition wall located at a nearest position in the second direction is long is assumed as the first position, and the other position where the distance is short is assumed as the second position, since both the piezoelectric body and the vibration plate are provided at the first position and the second position, compared to a configuration in which both the piezoelectric body and the vibration plate are provided at the first position and only the piezoelectric body is provided at the second position, stress is concentrated on the vibration plate in the vicinity of the boundary between the first position and the second position when the piezoelectric body is deformed, and the occurrence of the cracks can be suppressed in the vibration plate. In addition, according to the liquid discharging head of the embodiment, since the thickness of the vibration plate at the second position is smaller than the thickness of the vibration plate at the first position, the neutral axis at the first position can be disposed at the position closer to the vibration plate side than the piezoelectric body, and the neutral axis at the second position can be disposed at the position closer to the piezoelectric body side than the vibration plate. Therefore, the neutral surface of the vibration plate, that is, the portion where the vibration plate is not loaded when the bending moment is applied to the vibration plate by the piezoelectric body, is located on the piezoelectric body side in the first position, and is located on the vibration plate side in the second position. Therefore, in the first position and the second position, the portion that is not affected by the stress when the piezoelectric body is deformed can be disposed at different positions, so that the rigidity of the vibration plate as a whole can be increased.

(2) In the liquid discharging head of the above embodiment, the sum of the thickness of the vibration plate and the thickness of the piezoelectric body at the second position may be smaller than the sum of a thickness of the vibration plate and the thickness of the piezoelectric body at the first position.

According to the liquid discharging head of the embodiment, since the sum of the thickness of the vibration plate and the thickness of the piezoelectric body in the second position is smaller than the sum of the thickness of the vibration plate and the thickness of the piezoelectric body in the first position, the thickness in the first position can be made larger than the thickness in the second position, in the same manner as a case of focusing only on the thickness of the vibration plate or a case of focusing only on the thickness of the piezoelectric body, even when focusing on the total thickness of the vibration plate and the piezoelectric body.

(3) In the liquid discharging head of the above embodiment, the thickness of the piezoelectric body at the second position may be smaller than the thickness of the piezoelectric body at the first position.

According to the liquid discharging head of the embodiment, since the thickness of the piezoelectric body at the second position is smaller than the thickness of the piezoelectric body at the first position, compared to a configuration in which the piezoelectric body having the same thickness is provided at the first position and the second position, a decrease in the deformation efficiency of the piezoelectric body can be suppressed.

(4) In the liquid discharging head of the above embodiment, the difference of the thickness of the vibration plate and the thickness of the piezoelectric body at the second position may be smaller than the difference of the thickness of the vibration plate and the thickness of the piezoelectric body at the first position.

According to the liquid discharging head of the embodiment, since the difference between the thickness of the vibration plate and the thickness of the piezoelectric body in the second position is smaller than the difference between the thickness of the vibration plate and the thickness of the piezoelectric body in the first position, the neutral axis in the second position can be disposed at a position closer to the piezoelectric body side than the vibration plate.

(5) In the liquid discharging head of the above embodiment, the sum of the thickness of the vibration plate and the thickness of the piezoelectric body at the second position may be larger than the thickness of the vibration plate at the first position and is also larger than the thickness of the piezoelectric body at the first position.

According to the liquid discharging head of the embodiment, since the sum of the thickness of the vibration plate and the thickness of the piezoelectric body in the second position is larger than the thickness of the vibration plate at the first position and larger than the thickness of the piezoelectric body at the first position, the total thickness of the vibration plate and the piezoelectric body at the second position can be made larger than the thickness of the vibration plate in the first position and the thickness of the piezoelectric body in the first position, respectively.

(6) In the liquid discharging head of the above embodiment, the thickness of the piezoelectric body may be larger than the thickness of the vibration plate at the second position.

(7) In the liquid discharging head of the above embodiment, the thickness of the piezoelectric body may be smaller than the thickness of the vibration plate at the first position.

(8) In the liquid discharging head of the above embodiment, an end portion of the vibration plate on the one side at the second position is disposed at the same position as an end portion of the vibration plate on the one side at the first position.

An end portion of the vibration plate on the other side at the second position may be disposed closer to the one side than an end portion of the vibration plate on the other side at the first position.

According to the liquid discharging head of the embodiment, since the end portion of the vibration plate on the one side at the second position is disposed at the same position as the end portion of the vibration plate on the one side at the first position, and the end portion of the vibration plate on the other side at the second position is disposed closer to the one side than the end portion of the vibration plate on the other side at the first position, the thickness of the vibration plate can be formed on the other side of the vibration plate. For this reason, it is possible to suppress a decrease in the physical degree of adhesion between the vibration plate and the pressure chamber substrate.

(9) In the liquid discharging head of the above embodiment, the vibration plate has the elastic body layer and the insulation layer provided on the other side in the first direction with respect to the elastic body layer, the thickness of the insulation layer at the second position may be equal to the thickness of the insulation layer at the first position, and the thickness of the elastic body layer at the second position may be smaller than the thickness of the elastic body layer at the first position.

According to the liquid discharging head of the embodiment, since the thickness of the insulation layer at the second position is equal to the thickness of the insulation layer at the first position and the thickness of the elastic body layer at the second position is smaller than the thickness of the elastic body layer at the first position, the total thickness of the vibration plate can be made different between the first position and the second position by making the thickness of the elastic body layer different between the first position and the second position.

(10) In the liquid discharging head of the above embodiment, the vibration plate has the elastic body layer, the adhesion layer provided on the other side in the first direction with respect to the elastic body layer, and the insulation layer provided on the other side with respect to the adhesion layer, the thickness of the insulation layer at the second position may be equal to the thickness of the insulation layer at the first position, the thickness of the elastic body layer at the second position may be equal to a thickness of the elastic body layer at the first position, and the thickness of the adhesion layer at the second position may be smaller than a thickness of the adhesion layer at the first position.

According to the liquid discharging head of the embodiment, since the thickness of the insulation layer at the second position is equal to the thickness of the insulation layer at the first position, the thickness of the elastic body layer at the second position is equal to the thickness of the elastic body layer at the first position, and the thickness of the adhesion layer at the second position is smaller than the thickness of the adhesion layer at the first position, and the total thickness of the vibration plate can be made different between the first position and the second position by making the thickness of the adhesion layer different between the first position and the second position.

(11) In the liquid discharging head of the above embodiment, the elastic body layer may be made of silicon dioxide, and the insulation layer may be made of zirconium oxide.

According to the liquid discharging head of the embodiment, since the insulation layer is made of zirconium oxide, the mechanical strength of the vibration plate can be improved.

(12) In the liquid discharging head of the above embodiment, the liquid discharging head may include individual electrodes that are provided on the one side with respect to the piezoelectric body and are individually provided with respect to a plurality of the pressure chambers, and a common electrode that is provided on the other side in the first direction with respect to the piezoelectric body and is commonly provided with respect to the plurality of pressure chambers.

According to the liquid discharging head of the embodiment, since the plurality of pressure chambers have the individual electrodes provided individually and the common electrode provided commonly, a configuration in which the plurality of pressure chambers are separately controlled and a configuration in which the plurality of pressure chambers are collectively controlled can be easily realized by separately driving and controlling the individual electrodes and the common electrode.

(13) In the liquid discharging head of the above embodiment, the liquid discharging head may include the common electrode that is provided on the one side with respect to the piezoelectric body and is commonly provided with respect to a plurality of pressure chambers, and the individual electrodes that are provided on the other side in the first direction with respect to the piezoelectric body and are individually provided with respect to the plurality of pressure chambers.

According to the liquid discharging head of the embodiment, since the plurality of pressure chambers have the individual electrodes provided individually and the common electrode provided commonly, a configuration in which the plurality of pressure chambers are separately controlled and a configuration in which the plurality of pressure chambers are collectively controlled can be easily realized by separately driving and controlling the individual electrodes and the common electrode.

(14) In the liquid discharging head of the above embodiment, the liquid discharging head may include the drive control portion for driving the piezoelectric body by applying different drive voltages to the individual electrodes according to a discharge amount of the liquid and applying a constant holding voltage to the common electrode regardless of the discharge amount of the liquid.

According to the liquid discharging head of the embodiment, since the piezoelectric body is driven by applying different drive voltages to the first electrode according to the discharge amount of the liquid and applying the constant holding voltage to the second electrode regardless of the discharge amount of the liquid, the potential difference can be generated between the first electrode and the second electrode. Therefore, since the piezoelectric body can be deformed by the potential difference, pressure can be applied to the liquid accommodated in the pressure chamber.

(15) In the liquid discharging head of the above embodiment, when the position overlapping the partition wall in the second direction is assumed as a third position, both the piezoelectric body and the vibration plate may be provided at the third position, and a thickness of the vibration plate at the third position may be smaller than a thickness of the vibration plate at the first position.

According to the liquid discharging head of the embodiment, when the position overlapping the partition wall in the second direction is assumed as the third position, both the piezoelectric body and the vibration plate are provided in the third position, and since the thickness of the vibration plate in the third position is smaller than the thickness of the vibration plate in the first position, the position of the neutral axis in the third position can be disposed at a position closer to the vibration plate side than a position of the neutral axis in the first position.

(16) In the liquid discharging head of the above embodiment, the first position may be a central portion in the second direction in the pressure chamber, and the second position may be an end portion in the second direction in the pressure chamber.

According to the liquid discharging head of the embodiment, since the first position is the central portion in the pressure chamber in the second direction and the second position is the end portion in the pressure chamber in the second direction, the position of the neutral surface of the vibration plate can be made different between the central portion and the end portion in the pressure chamber in the second direction. Therefore, even in a case where stress is concentrated in the vicinity of the boundary between the central portion and the end portion when the piezoelectric body is deformed, the occurrence of the cracks can be suppressed in the vibration plate in the vicinity of the boundary.

(17) According to another embodiment of the present disclosure, the liquid discharging head is provided. The liquid discharging head includes a piezoelectric body, a vibration plate provided on one side in a first direction with respect to the piezoelectric body, and a pressure chamber substrate provided on the one side with respect to the vibration plate, the pressure chamber substrate including a plurality of partition walls that partition a pressure chamber for applying a pressure to a liquid, the piezoelectric body, the vibration plate, and the pressure chamber substrate being provided side by side in the first direction, in which when a central portion in a second direction intersecting with the first direction in the pressure chamber is assumed as a first position, and a position overlapping the partition wall in the second direction is assumed as a third position, both the piezoelectric body and the vibration plate may be provided at the first position and the third position, and a thickness of the vibration plate at the third position may be smaller than a thickness of the vibration plate at the first position.

According to the liquid discharging head of the embodiment, when the central portion in the second direction intersecting with the first direction in the pressure chamber is assumed as the first position, and the position overlapping the partition wall in the second direction is assumed as the third position, since both the piezoelectric body and the vibration plate are provided at the first position and the third position, compared to a configuration in which only the piezoelectric body is provided at the third position, in a case where stress is concentrated in the vicinity of the boundary between the first position and the third position when the piezoelectric body is deformed, the occurrence of the cracks can be suppressed by the concentration of the stress only on the vibration plate. In addition, since the thickness of the vibration plate at the third position is smaller than the thickness of the vibration plate at the first position, the neutral axis at the first position can be disposed at the position closer to the vibration plate side than the piezoelectric body, and the neutral axis at the third position can be disposed at the position closer to the piezoelectric body side than the vibration plate. Therefore, the neutral surface of the vibration plate, that is, the portion where the vibration plate is not loaded when the bending moment is applied to the vibration plate by the piezoelectric body, is located on the piezoelectric body side in the first position, and is located on the vibration plate side in the third position. Therefore, in the first position and the third position, the portion that is not affected by the stress when the piezoelectric body is deformed can be disposed at different positions, so that the rigidity of the vibration plate as a whole can be increased.

(18) According to another embodiment of the present disclosure, a method of manufacturing the liquid discharging head is provided. The method of manufacturing the liquid discharging head includes forming the elastic body layer on a surface of the pressure chamber substrate on which the plurality of partition walls are formed to partition the pressure chamber for applying the pressure to a liquid, the surface being on one side in the first direction, etching the formed elastic body layer to form a step such that the central portion in the second direction intersecting with the first direction is convex with respect to the pressure chamber substrate, and forming the piezoelectric body on the elastic body layer where the step is formed, on the one side in the first direction.

According to the method of manufacturing the liquid discharging head of the embodiment, the elastic body layer is formed on the surface of the pressure chamber substrate, the surface being on one side in the first direction, the formed elastic body layer is etched to form a step such that the central portion in the second direction intersecting with the first direction is convex with respect to the pressure chamber substrate, and the piezoelectric body is formed on the elastic body layer where the step is formed, on the one side in the first direction. Therefore, the piezoelectric body can be formed such that the central portion of the piezoelectric body in the second direction is convex with respect to the pressure chamber substrate.

(19) In the method of manufacturing the liquid discharging head of this embodiment, the step may be formed such that the thickness of the elastic body layer at the central portion in the second direction is larger than the thickness of the elastic body layer at the end portion in the second direction.

According to the method of manufacturing the liquid discharging head of the embodiment, since the step is formed such that the thickness of the elastic body layer at the central portion in the second direction is larger than the thickness of the elastic body layer at the end portion in the second direction, it is possible to easily form the vibration plate in which the thickness of the central portion in the second direction is larger than the thickness of the end portion in the second direction.

The present disclosure is not limited to the embodiment of the liquid discharging head described above, and may be realized in various embodiments such as a piezoelectric actuator, a liquid discharging apparatus including a liquid discharging head, and a method of manufacturing the liquid discharging head.

What is claimed is:

1. A liquid discharging head comprising:
a piezoelectric body;
a vibration plate provided on one side in a first direction with respect to the piezoelectric body; and
a pressure chamber substrate provided on the one side with respect to the vibration plate, the pressure chamber substrate including a plurality of partition walls that partition a pressure chamber for applying a pressure to a liquid, and
a nozzle plate in which a plurality of nozzles are arranged in a second direction intersecting with the first direction,
the piezoelectric body, the pressure chamber substrate, the vibration plate, and the nozzle plate being provided side by side in the first direction, wherein
in two positions in the second direction in the pressure chamber, when one position where a distance in the second direction to the partition wall located at a nearest position in the second direction is long is assumed as a first position, and the other position where the distance is short is assumed as a second position, both the piezoelectric body and the vibration plate are provided at the first position and the second position,
a thickness of the vibration plate at the second position is smaller than a thickness of the vibration plate at the first position, and
when a position in the vibration plate overlapping the partition wall in the second direction is assumed as a third position, a thickness of the vibration plate at the third position is smaller than the thickness of the vibration plate at the first position.

2. The liquid discharging head according to claim 1, wherein
a sum of a thickness of the vibration plate and a thickness of the piezoelectric body at the second position is smaller than a sum of a thickness of the vibration plate and a thickness of the piezoelectric body at the first position.

3. The liquid discharging head according to claim 1, wherein
a thickness of the piezoelectric body at the second position is smaller than a thickness of the piezoelectric body at the first position.

4. The liquid discharging head according to claim 1, wherein
a difference between a thickness of the vibration plate and a thickness of the piezoelectric body at the second position is smaller than a difference between a thickness of the vibration plate and a thickness of the piezoelectric body at the first position.

5. The liquid discharging head according to claim 1, wherein
a sum of a thickness of the vibration plate and a thickness of the piezoelectric body at the second position is larger than a thickness of the vibration plate at the first position and is larger than a thickness of the piezoelectric body at the first position.

6. The liquid discharging head according to claim 1, wherein
a thickness of the piezoelectric body is larger than a thickness of the vibration plate at the second position.

7. The liquid discharging head according to claim 1, wherein
a thickness of the piezoelectric body is smaller than a thickness of the vibration plate at the first position.

8. The liquid discharging head according to claim 1, wherein
an end portion of the vibration plate on the one side at the second position is disposed at the same position as an end portion of the vibration plate on the one side at the first position, and an end portion of the vibration plate on the other side at the second position is disposed closer to the one side than an end portion of the vibration plate on the other side at the first position.

9. The liquid discharging head according to claim 1, wherein
the vibration plate has an elastic body layer and an insulation layer provided on the other side in the first direction with respect to the elastic body layer,
a thickness of the insulation layer at the second position is equal to a thickness of the insulation layer at the first position, and
a thickness of the elastic body layer at the second position is smaller than a thickness of the elastic body layer at the first position.

10. The liquid discharging head according to claim 1, wherein
the vibration plate has an elastic body layer, an adhesion layer provided on the other side in the first direction with respect to the elastic body layer, and an insulation layer provided on the other side with respect to the adhesion layer,
a thickness of the insulation layer at the second position is equal to a thickness of the insulation layer at the first position,
a thickness of the elastic body layer at the second position is equal to a thickness of the elastic body layer at the first position, and
a thickness of the adhesion layer at the second position is smaller than a thickness of the adhesion layer at the first position.

11. The liquid discharging head according to claim 9, wherein
the elastic body layer is made of silicon dioxide, and
the insulation layer is made of zirconium oxide.

12. The liquid discharging head according to claim 1, further comprising:
individual electrodes that are provided on the one side with respect to the piezoelectric body and are individually provided with respect to a plurality of the pressure chambers; and
a common electrode that is provided on the other side in the first direction with respect to the piezoelectric body and is commonly provided with respect to the plurality of pressure chambers.

13. The liquid discharging head according to claim 1, further comprising:
a common electrode that is provided on the one side with respect to the piezoelectric body and is commonly provided with respect to a plurality of the pressure chambers; and
individual electrodes that are provided on the other side in the first direction with respect to the piezoelectric body and are individually provided with respect to the plurality of pressure chambers.

14. The liquid discharging head according to claim 12, further comprising:
a drive control portion for driving the piezoelectric body by applying different drive voltages to the individual electrodes according to a discharge amount of the liquid and applying a constant holding voltage to the common electrode regardless of the discharge amount of the liquid.

15. The liquid discharging head according to claim 1, wherein
the piezoelectric body is provided at the third position.

16. The liquid discharging head according to claim 1, wherein
the first position is a central portion in the second direction in the pressure chamber, and
the second position is an end portion in the second direction in the pressure chamber.

17. The liquid discharging head according to claim 1, wherein a thickness of the vibration plate at the third position is same as a thickness of the vibration plate at the second position.

18. The liquid discharging head according to claim 15, wherein a thickness of the piezoelectric body at the third position is same as a thickness of the piezoelectric body at the second position.

* * * * *